(12) United States Patent
Kitagawa et al.

(10) Patent No.: US 10,344,177 B2
(45) Date of Patent: Jul. 9, 2019

(54) UNDER LAYER FILM-FORMING COMPOSITION FOR IMPRINTS AND METHOD FOR FORMING PATTERN

(71) Applicant: FUJIFILM Corporation, Tokyo (JP)

(72) Inventors: Hirotaka Kitagawa, Shizuoka (JP); Yuichiro Enomoto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 740 days.

(21) Appl. No.: 14/860,767

(22) Filed: Sep. 22, 2015

(65) Prior Publication Data

US 2016/0009946 A1 Jan. 14, 2016

Related U.S. Application Data

(63) Continuation of application No. PCT/JP2014/058324, filed on Mar. 25, 2014.

(30) Foreign Application Priority Data

Mar. 26, 2013 (JP) .................. 2013-063380

(51) Int. Cl.
| | |
|---|---|
| *C09D 151/08* | (2006.01) |
| *G03F 7/00* | (2006.01) |
| *G03F 7/038* | (2006.01) |
| *G03F 7/11* | (2006.01) |
| *B29C 59/00* | (2006.01) |
| *C09D 151/00* | (2006.01) |
| *B29K 63/00* | (2006.01) |
| *B29K 96/02* | (2006.01) |

(52) U.S. Cl.
CPC .......... *C09D 151/08* (2013.01); *B29C 59/005* (2013.01); *C09D 151/003* (2013.01); *G03F 7/0002* (2013.01); *G03F 7/038* (2013.01); *G03F 7/0388* (2013.01); *G03F 7/11* (2013.01); *B29K 2063/00* (2013.01); *B29K 2096/02* (2013.01)

(58) Field of Classification Search
CPC ..................................................... C09D 151/08
See application file for complete search history.

(56) References Cited

U.S. PATENT DOCUMENTS

| | | |
|---|---|---|
| 2009/0155583 A1 | 6/2009 | Xu et al. |
| 2012/0128891 A1 | 5/2012 | Takei et al. |
| 2012/0231234 A1 | 9/2012 | Kodama |
| 2015/0099070 A1 | 4/2015 | Takei et al. |

FOREIGN PATENT DOCUMENTS

| | | |
|---|---|---|
| EP | 1 923 741 A2 | 5/2008 |
| EP | 2 319 893 A1 | 5/2011 |
| EP | 2 461 350 A1 | 6/2012 |

(Continued)

OTHER PUBLICATIONS

Office Action dated Apr. 13, 2017, mailed from the Intellectual Property Office of Taiwan in counterpart Taiwan Application No. 103110222.

(Continued)

*Primary Examiner* — Larry W Thrower
(74) *Attorney, Agent, or Firm* — Sughrue Mion, PLLC

(57) ABSTRACT

Provided is a composition for forming underlying layer for imprints, which is excellent in surface flatness and adhesiveness. The composition for forming underlying layer for imprints comprises (A) a resin having an ethylenic unsaturated group (P), and a cyclic ether group (T) selected from oxiranyl group and oxetanyl group, and having a weight-average molecular weight of 1000 or larger; and, (B) a solvent.

11 Claims, 1 Drawing Sheet

(56) References Cited

FOREIGN PATENT DOCUMENTS

| EP | 2 490 072 A2 | 8/2012 |
|---|---|---|
| JP | 2009-503139 A | 1/2009 |
| JP | 2011-508680 A | 3/2011 |
| JP | 2011-164570 A | 8/2011 |
| KR | 10-2012-0102008 A1 | 9/2012 |
| TW | 201129869 A | 9/2011 |
| WO | 2004/044654 A2 | 5/2004 |
| WO | 2007/050133 A2 | 5/2007 |
| WO | 2009/085090 A1 | 7/2009 |

OTHER PUBLICATIONS

Office Action dated Sep. 3, 2016, issued by the Korean Intellectual Property Office in corresponding Korean Application No. 10-2015-7024945.
Office Action dated Mar. 21, 2016, issued by the Korean Intellectual Property Office in corresponding Korean Application No. 10-2015-7024945.
Office Action dated Apr. 5, 2016, issued by the Japan Patent Office in corresponding Japanese Application No. 2013-063380.
Extended European Search Report dated Jan. 19, 2016, from the European Patent Office in counterpart European Application No. 14772754.9.
International Preliminary Report on Patentability issued from the International Bureau in counterpart International Application No. PCT/JP2014/058324, dated Oct. 8, 2015.
M. Colburn et al., "Step and flash Imprint Lithography: A New Approach to High-Resolution Patterning", SPIE, Part of the SPIE Conference on Emerging Lithographic Technologies III, Mar. 1999, pp. 379-389, vol. 3676.
Stephen Y. Chou et al., "Imprint of sub-25 nm vias and trenches in polymers", Applied Physics Letters, Nov. 20, 1995, pp. 3114-3116, vol. 67, No. 21.
International Search Report for PCT/JP2014/058324 dated May 27, 2014.
Written Opinion for PCT/JP2014/058324 dated May 27, 2014.

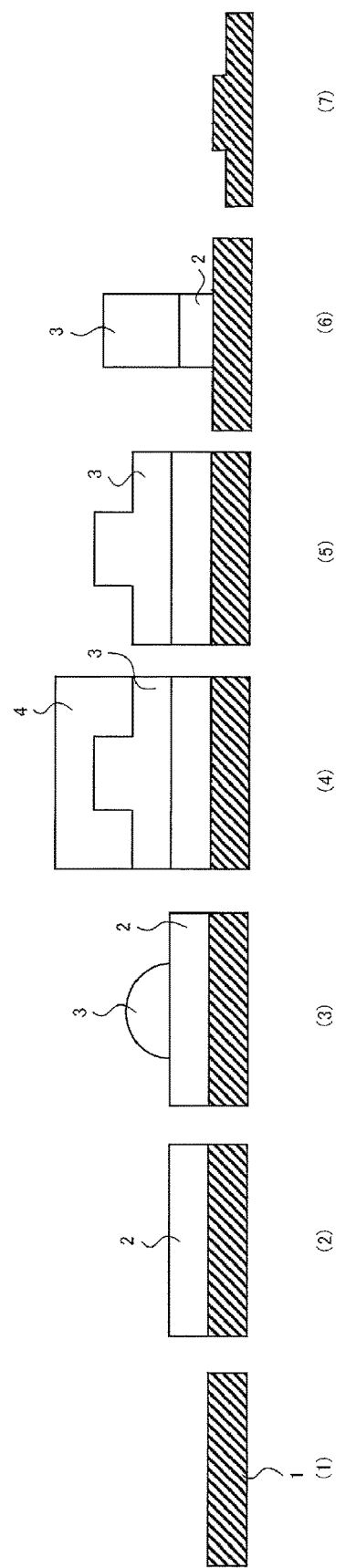

UNDER LAYER FILM-FORMING COMPOSITION FOR IMPRINTS AND METHOD FOR FORMING PATTERN

This application is a Continuation of PCT International Application No. PCT/JP2014/058324 filed on Mar. 25, 2014, which claims priority under 35 U.S.C § 119(a) to Japanese Patent Application No. 2013-063380 filed on Mar. 26, 2013. Each of the above applications are hereby expressly incorporated by reference, in its entirety, into the present application.

TECHNICAL FIELD

The present invention relates to a under layer film-forming composition for imprints used for improving adhesiveness between a curable composition for imprints and a substrate (sometimes simply referred to as "under layer film-forming composition", hereinafter). The present invention also relates to a method for forming a pattern using a cured film obtained by curing the under layer film-forming composition and a curable composition for imprints. In addition, the present invention also relates to a method for manufacturing a semiconductor device using the under layer film-forming composition, and a semiconductor device.

More precisely, the invention relates to an under layer film-forming composition for patterning through photoirradiation to give imprints, which is used in producing magnetic recording media such as semiconductor integrated circuits, flat screens, microelectromechanical systems (MEMS), sensor devices, optical discs, high-density memory discs, etc.; optical members such as gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, mold for imprint etc.

DESCRIPTION OF THE RELATED ART

Nanoimprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of nanoimprint technology have been proposed; one is a thermal nanoimprint method using a thermoplastic resin as the material to be worked (for example, see S. Chou, et al., Appl. Phys. Lett. Vol. 67, 3114 (1995)), and the other is a photonanoimprint method using a photocurable composition (for example, see M. Colbun, et al., Proc. SPIE, Vol. 3676, 379 (1999)). In the thermal nanoimprint method, a mold is pressed against a polymer resin heated up to a temperature not lower than the glass transition temperature thereof, then the resin is cooled and thereafter released from the mold to thereby transfer the microstructure of the mold onto the resin on a substrate. This method is very simple and convenient, and is applicable to a variety of resin materials and glass materials.

On the other hand, imprinting is known as a method for transferring a micro-pattern onto a photo-cured material, by allowing a curable composition to cure under photo-irradiation through a translucent mold or a translucent substrate, and then by separating the mold. The imprinting may be implemented at room temperature, so that it is applicable to the field of precision working typically for forming ultra-fine patterns such as semiconductor integrated circuit. In recent years, new trends in development of nano-casting based on combination of advantages of the both, and reversal imprinting capable of creating a three-dimensional laminated structure have been reported.

Applications listed below have been proposed for the imprinting.

A first application relates to that a geometry (pattern) per se obtained by molding is functionalized so as to be used as a nano-technology component, or a structural member. Examples of which include a variety of micro- or nano-optical component, high-density recording medium, optical film, and structural member of flat panel display.

A second application relates to building-up of a laminated structure by using a mold capable of simultaneously forming a micro-structure and a nano-structure, or by simple alignment between layers, and use of the laminated structure for manufacturing μ-TAS (Micro-Total Analysis System) or biochip.

A third application relates to use of the thus-formed pattern as a mask through which a substrate is worked typically by etching. By virtue of precise alignment and a large degree of integration, this technique can replace the conventional lithographic technique in manufacturing of high-density semiconductor integrated circuit, transistors in liquid crystal display device, and magnetic material for composing next-generation hard disk called patterned medium. Approaches for implementing the imprinting in these applications have been becoming more active in recent years.

With progress of activities in the imprinting, there has been emerging a problem of adhesiveness between the substrate and the curable composition for imprints. In the imprinting, the curable composition for imprints is coated over the substrate, and is allowed to cure under photo-irradiation, while being brought into contact on the surface thereof with a mold, and then the mold is separated. In the process of separating the mold, the cured product may sometimes separate from the substrate, and unfortunately adhere to the mold. This is supposedly because the adhesiveness between the substrate and the cured material is smaller than the adhesiveness between the mold and the cured material. As a solution to this problem, there has been discussed an under layer film-forming composition for imprints for enhancing the adhesiveness between the substrate and the cured material (Patent Literature 1).

CITATION LIST

Patent Literature

[Patent Literature 1] JP-A-2009-503139

Non Patent Literature

[Non Patent Literature 1] S. Chou et al.: Appl. Phys. Lett. Vol. 67, 3114(1995)

[Non Patent Literature 2] M. Colbun et al,: Proc. SPIE, Vol. 3676, 379 (1999)

SUMMARY OF THE INVENTION

Technical Problem

According to Patent Literature 1, the adhesiveness is improved by using a novolac-base resin and a low molecular methylol-base curing agent. Investigations on Patent Literature 1 by thelaminate present inventors, however, revealed that the underlying layer showed only a poor surface flatness when given in the form of an extra-thin film. The poor surface flatness of the underlying layer may degrade the adhesiveness, and may result in separation failure.

It is therefore an object of this invention to solve the problem described above, and to provide a composition for forming underlying layer for imprints, for forming the underlying layer, which demonstrates a large adhesiveness to the layer to be imprinted, has a good surface flatness, and is less likely to cause separation failure when the layer to be imprinted is released from a mold.

Solution to Problem

The present inventors found from our further investigations into Patent Literature 1 that the degraded surface flatness of the underlying layer is attributable to a large cure contraction, due to use of the low molecular methylol-base curing agent. More specifically, under the large cure contraction, the underlying layer will have cracks on the surface thereof, to degrade the surface flatness. The present inventors found that the surface flatness of the underlying layer, when given in the form of an extra-thin film, may be improved in the surface flatness, by making use of a ring-opening reaction of a cyclic ether group, characterized by a small volume contraction induced by curing, which led us to complete this invention.

More specifically, the above-described problems were solved by means [1] below, and more preferably by means [2] to [15] below.

[1] A composition for forming underlying layer for imprints, the composition comprising: (A) a resin having an ethylenic unsaturated group (P), and a cyclic ether group (T) selected from oxiranyl group and oxetanyl group, and having a weight-average molecular weight of 1000 or larger; and, (B) a solvent.

[2] The composition for forming underlying layer for imprints of [1], wherein the (A) resin is a copolymer comprising a repeating unit having the ethylenic unsaturated group (P), and a repeating unit having the cyclic ether group (T) selected from oxiranyl group and oxetanyl group.

[3] The composition for forming underlying layer for imprints of [1], wherein the (A) resin is a copolymer comprising 10 to 97 mol %, relative to a total repeating units, of the repeating unit having the ethylenic unsaturated group (P), and 3 to 90 mol %, relative to a total repeating units, of the repeating unit having the cyclic ether group (T) selected from oxiranyl group and oxetanyl group.

[4] The composition for forming underlying layer for imprints of any one of [1] to [3], wherein the ethylenic unsaturated group (P) is a (meth)acryloyloxy group.

[5] The composition for forming underlying layer for imprints of any one of [1] to [4], wherein the (A) resin comprises at least one species of repeating unit represented by any of Formulae (I) to (III), and at least one species of repeating unit represented by Formulae (IV) to (VI):

[Chemical Formula 1]

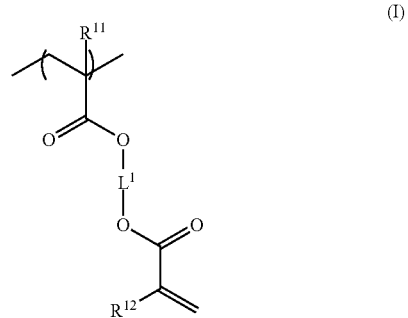

(I)

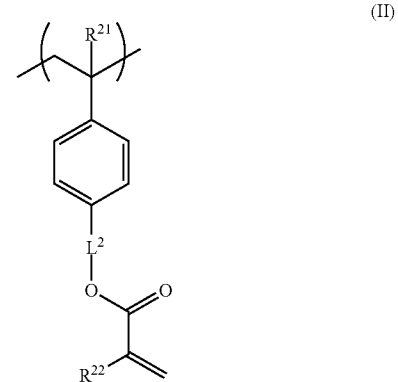

(II)

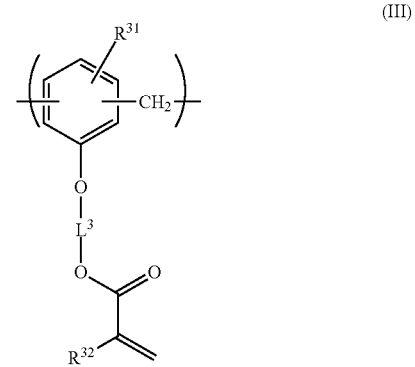

(III)

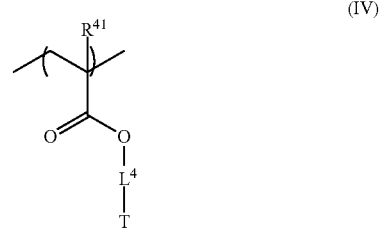

(IV)

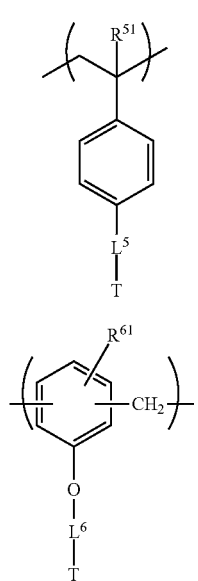

wherein each of $R^{11}$, $R^{12}$, $R^{21}$, $R^{22}$, $R^{31}$, $R^{32}$, $R^{41}$, $R^{51}$ and $R^{61}$ independently represents a hydrogen atom or methyl group; each of $L^1$, $L^2$, $L^3$, $L^4$, $L^5$ and $L^6$ independently represents a single bond or alkylene group having 1 to 10 carbon atoms, the alkylene chain may contain at least one of ether bond, ester bond, amide bond and urethane bond, and a hydrogen atom in the alkylene group may be substituted by a hydroxy group; and T represents any of cyclic ether groups represented by Formulae (T-1), (T-2) and Formula (T-3);

[Chemical Formula 2]

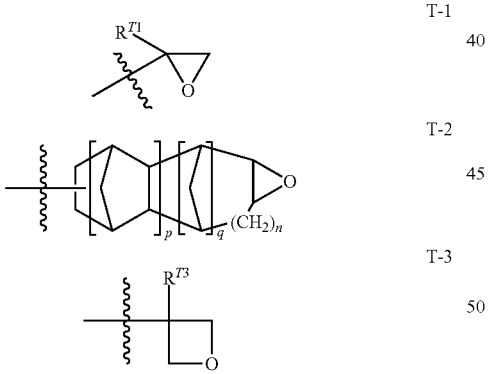

wherein each of $R^{T1}$ and $R^{T3}$ independently represents a hydrogen atom or alkyl group having 1 to 5 carbon atoms; p represents an integer of 0 or 1, q represents an integer of 0 or 1, and n represents an integer of 0 to 2; each wavy line indicates a position beyond where $L^4$, $L^5$ or $L^6$ is bound.

[6] The composition for forming underlying layer for imprints of [5], wherein the cyclic ether group (T) is a group represented by Formula (T-1).

[7] The composition for forming underlying layer for imprints of any one of [1] to [6], wherein the (A) resin comprises at least one species of repeating units represented by Formulae (I-1) to (IV-1):

[Chemical Formula 3]

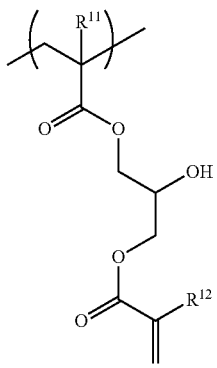

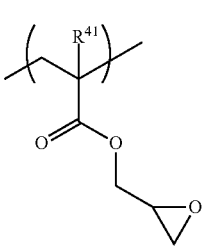

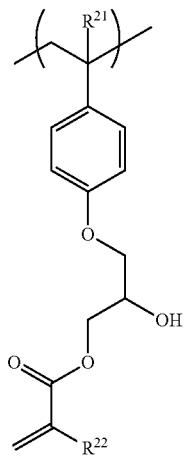

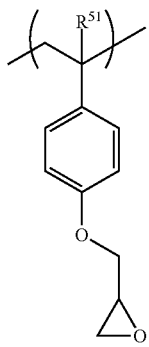

-continued

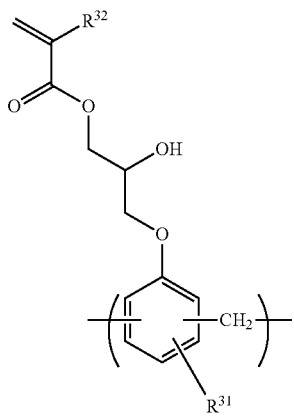

(III-1)

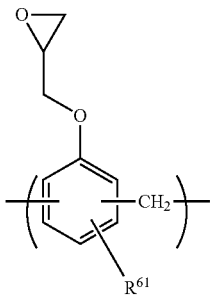

(VI-1)

wherein each of $R^{11}$, $R^{12}$, $R^{21}$, $R^{22}$, $R^{31}$, $R^{32}$, $R^{41}$, $R^{51}$ and $R^{61}$ independently represents a hydrogen atom or methyl group.

[8] The composition for forming underlying layer for imprints of any one of [1] to [7], wherein the (A) resin is a (meth)acrylic resin.

[9] The composition for forming underlying layer for imprints of any one of [1] to [8], which comprises 1.0% by mass or less of the (A) resin in the composition for forming underlying layer for imprints.

[10] The composition for forming underlying layer for imprints of any one of [1] to [9], wherein the composition for forming underlying layer for imprints contains a (C) acid or acid generator.

[11] The composition for forming underlying layer for imprints of any one of [1] to [10], wherein the composition for forming underlying layer for imprints contains 0.05 to 1.0% by mass of the (A) resin, 98.0 to 99.95% by mass of the (B) solvent, and 0.0005 to 0.1% by mass of a (C) acid or acid generator.

[12] A laminate comprising: a substrate; and an underlying layer obtainable by curing, on a surface of the substrate, the composition for forming underlying layer for imprints described in any one of [1] to [11].

[13] A method for forming a fine pattern comprising: coating the composition for forming underlying layer for imprints described in any one of [1] to [11], over a substrate; forming an underlying layer, by curing the coated composition for forming underlying layer for imprints; coating a photo-curable composition for imprints over the underlying layer; pressing thereto a mold with a fine pattern; curing the photo-curable composition for imprints by photo-irradiation, while keeping the photo-curable composition for imprints pressed under the mold; and releasing the mold.

[14] A method for forming a fine pattern of [13], wherein the forming an underlying layer is carried out by curing the composition for forming underlying layer for imprints under heating at 120 to 160° C.

[15] A method for manufacturing a semiconductor device, comprising the method for forming a fine pattern described in [13] or [14].

Advantageous Effects of Invention

By using the under layer film-forming composition for imprints of the present invention, it now became possible to provide the under layer film which demonstrates a large adhesiveness to the layer to be imprinted, has a good surface flatness, and is less likely to cause separation failure when the layer to be imprinted is released from a mold.

BRIEF DESCRIPTION OF DRAWINGS

FIG. 1 illustrates an exemplary manufacturing process when the curable composition for imprints is used for working of a substrate by etching.

DESCRIPTION OF EMBODIMENTS

The contents of the invention are described in detail hereinunder. In this description, the numerical range expressed by the wording "a number to another number" means the range that falls between the former number indicating the lowermost limit of the range and the latter number indicating the uppermost limit thereof.

In this description, "(meth)acrylate" means acrylate and methacrylate; "(meth)acrylic" means acrylic and methacrylic; "(meth)acryloyl" means acryloyl and methacryloyl. In the invention, monomer is differentiated from oligomer and polymer, and the monomer indicates a compound having a weight-average molecular weight of at most 1,000. In this specification, "functional group" means a group relevant to polymerization reaction.

"Imprint" referred to in the invention is meant to indicate pattern transfer in a size of from 1 nm to 10 mm and preferably meant to indicate pattern transfer in a size of from about 10 nm to 100 μm (nanoimprint).

The composition for forming underlying layer for imprints of this invention characteristically contains: (A) a resin having an ethylenic unsaturated group (P), and a cyclic ether group (T) selected from oxiranyl group and oxetanyl group, and having a weight-average molecular weight of 1000 or larger; and, (B) a solvent.

Since the resin (A) contains the ethylenic unsaturated group (P), the underlying layer may be improved in the adhesiveness to the layer to be imprinted, and, since the cyclic ether group (T) selected from oxiranyl group and oxetanyl group is contained, the underlying layer may effectively be prevented from shrinking during heat curing, and from cracking on the surface thereof, to improve the surface flatness. As a result of improvement in the adhesiveness to the layer to be imprinted and in the surface flatness of the underlying layer, the separation failure will be less likely to occur. In addition, by using the resin (A), it now becomes possible to cure the underlying layer without using any low molecular linking agent, and thereby defects attributable to sublimation of the curing agent during the heat curing becomes avoidable.

The present inventors also found that the composition for forming underlying layer shows a good curability even at low temperatures, by using the resin (A). More specifically, a good underlying layer may be obtained by curing the composition for forming underlying layer, even at low temperatures typically in the range from 120 to 160° C.

Now, the cyclic ether group (T) selected from oxiranyl group and oxetanyl group means a group having an oxirane structure (cyclic ether having a three-membered ring structure) or an oxetane structure (cyclic ether having a four-membered ring structure). The oxirane structure or oxetane structure may be fused with other ring to form a fused ring.

The resin (A) is preferably a (meth)acrylic resin. By using the (meth)acrylic resin, removability of etching residue will be more likely to improve.

Configuration of this invention will be further detailed below.

The resin (A) contains the ethylenic unsaturated group (P), and the cyclic ether group (T) selected from oxiranyl group and oxetanyl group, in the same repeating unit, or in separate repeating units, and preferably in separate repeating units.

In other words, the resin (A) used in this invention is preferably a copolymer which contains the repeating unit having the ethylenic unsaturated group (P), and the repeating unit having the cyclic ether group (T) selected from oxiranyl group and oxetanyl group. When the resin (A) is configured as the copolymer, the ratio of the repeating unit having the ethylenic unsaturated group (P) is preferably 5 to 99 mol % relative to the total repeating units, more preferably 10 to 97 mol %, even more preferably 30 to 95 mol %, and particularly 50 to 90 mol %. The ratio of repeating unit having the cyclic ether group (T) selected from oxiranyl group and oxetanyl group is preferably 1 to 95 mol % relative to the total repeating units, more preferably 3 to 90 mol %, even more preferably 5 to 70 mol %, and particularly 10 to 50 mol %. By controlling the ratio of the cyclic ether group (T) to 5 mol % or more, the resin (A) will be advantageous in that it can form a good under lying layer even if cured at low temperatures. The resin (A) used in this invention may contain a repeating unit other than ethylenic unsaturated group (P), and the cyclic ether group (T) selected from oxiranyl group and oxetanyl group (may occasionally be referred to as "other repeating unit", hereinafter). The ratio of such other repeating unit, when contained, is preferably 1 to 30 mol %, and more preferably 5 to 25 mol %.

The resin (A) may contain one species of each of the ethylenic unsaturated group (P), the cyclic ether group (T) selected from oxiranyl group and oxetanyl group, and the other repeating unit; or may contain two or more species of each of them. When two or more species of them are contained, the total content of them preferably follows the ratio described above.

The ethylenic unsaturated group (P) is preferably (meth) acryloyloxy group, (meth)acryloylamino group, maleimide group, allyl group or vinyl group, wherein (meth)acryloyloxy group is more preferable.

The repeating unit having the ethylenic unsaturated group (P) is preferably selected from repeating units represented by Formulae (I) to (III) below.

[Chemical Formula 4]

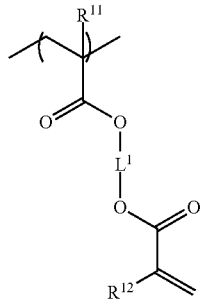

(I)

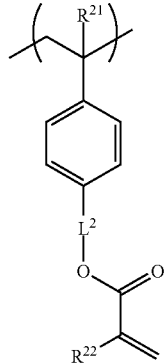

(II)

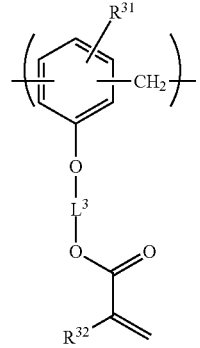

(III)

(In Formulae (I) to (III), each of $R^{11}$, $R^{12}$, $R^{21}$, $R^{22}$, $R^{31}$ and $R^{32}$ independently represents a hydrogen atom or methyl group. Each of $L^1$, $L^2$ and $L^3$ independently represents a single bond or alkylene group having 1 to 10 carbon atoms, the alkylene chain may contain at least one of ether bond, ester bond, amide bond and urethane bond, and a hydrogen atom in the alkylene group may be substituted by a hydroxy group.

$R^{11}$ and $R^{31}$ more preferably represents a methyl group, and each of $R^{12}$, $R^{21}$, $R^{22}$ and $R^{32}$ more preferably represents a hydrogen atom.

Each of $L^1$, $L^2$, and $L^3$ represents a group composed of one or more (—$CH_2$—)s, or, a group composed of one or more (—$CH_2$—)s combined with at least any one of —CH (OH)—, —O— and —C(=O)—. The number of atoms composing the linking chain represented by $L^1$, $L^2$, and $L^3$ (which means, for example in Formula (II), the number of atoms composing the chain which connects the benzene ring, adjacent to $L^2$, and the oxygen atom again adjacent to $L^2$, and the number is specifically 4 for example in the compound resented by Formula (II-1)) is preferably 1 to 20, and more preferably 2 to 10.

Specific examples of the repeating unit having the ethylenic unsaturated group (P) are enumerated below, to which this invention is of course not limited. Each of $R^{11}$, $R^{12}$, $R^{21}$, $R^{22}$, $R^{31}$ and $R^{32}$ independently represents a hydrogen atom or methyl group.
[Chemical Formula 5]
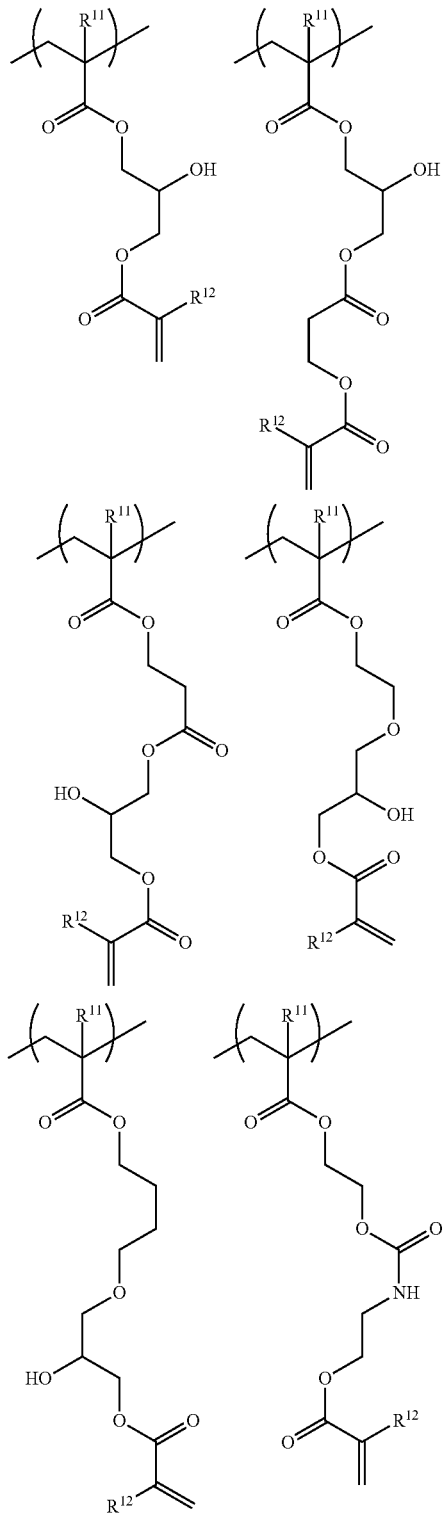
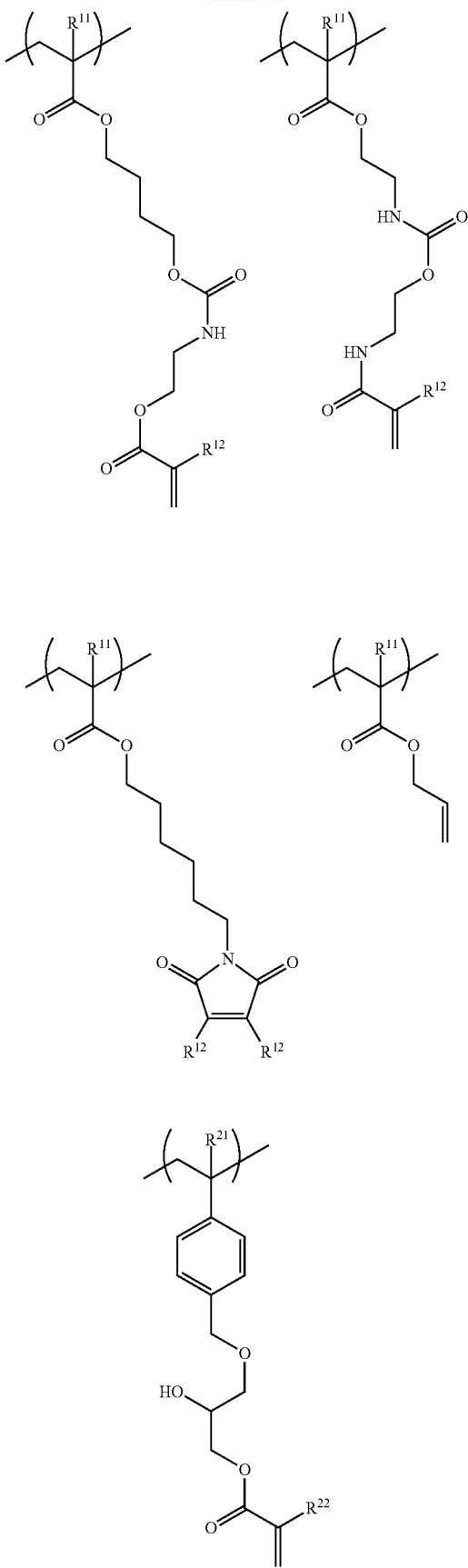

-continued

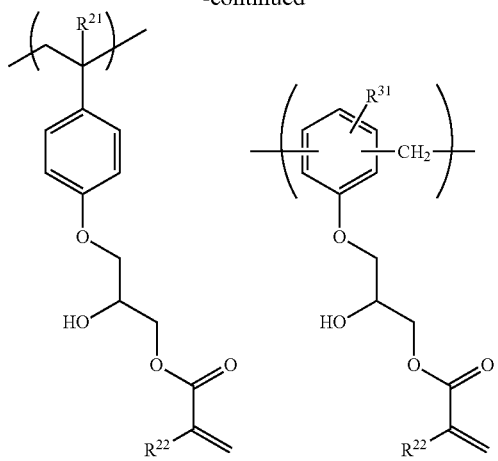

Among the compounds shown above, the following compounds are preferable.

[Chemical Formula 6]

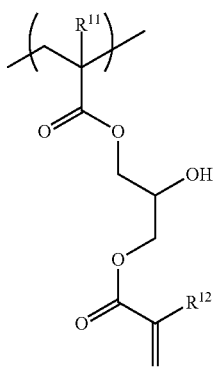
(I-1)

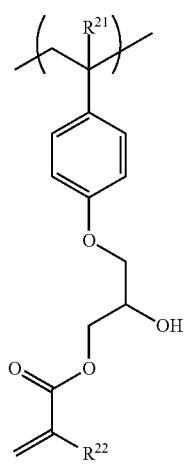
(II-1)

-continued

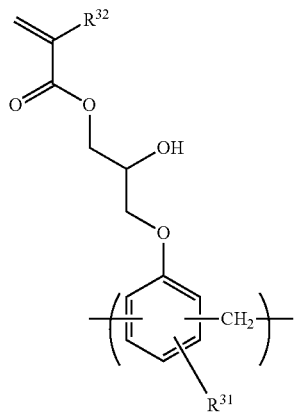
(III-1)

The repeating unit having a cyclic ether group (T) selected from oxiranyl group and oxetanyl group is preferably selected from the repeating units represented by Formulae (IV) to (VI) below.

[Chemical Formula 7]

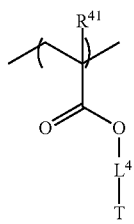
(IV)

(V)

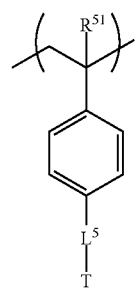
(VI)

(In Formula (IV) to (VI), each of $R^{41}$, $R^{51}$ and $R^{61}$ independently represents a hydrogen atom or methyl group. Each of $L^4$, $L^5$ and $L^6$ independently represents a single bond or an alkylene group having 1 to 10 carbon atoms, the alkylene chain may contain at least one of ether bond, ester bond, amide bond and urethane bond, and a hydrogen atom in the alkylene group may be substituted by a hydroxy group. T represents any of cyclic ether groups represented by Formulae (T-1), (T-2) and Formula (T-3).)

[Chemical Formula 8]

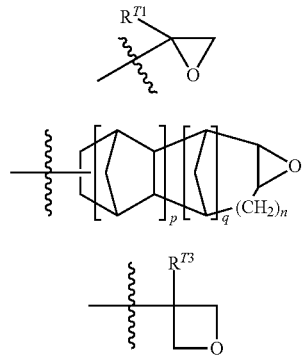

(In Formulae (T-1) to (T-3), each of $R^{T1}$ and $R^{T3}$ independently represents a hydrogen atom or an alkyl group having 1 to 5 carbon atoms. p represents an integer of 0 or 1, q represents an integer of 0 or 1, and n represents an integer of 0 to 2. Each wavy line indicates a position beyond where $L^4$, $L^5$ or $L^6$ is bound.)

Each of $R^{41}$ and $R^{61}$ more preferably represents a methyl group, and $R^{51}$ more preferably represents a hydrogen atom.

Each of $L^4$, $L^5$ and $L^6$ preferably represents a single bond, a group composed of one or more (—$CH_2$—)s, or, a group composed of one or more (—$CH_2$—)s combined with at least any one of —CH(OH)—, —O— and —C(=O)—, more preferably represents a single bond or a group composed of one or more (—$CH_2$—)s, and even more preferably a group composed of 1 to 3 (—$CH_2$—)s.

The number of atoms composing the linking chains represented by $L^4$, $L^5$ and $L^6$ is preferably 1 to 5, more preferably 1 to 3, and even more preferably 1 or 2.

It is preferable that each of $R^{T1}$ and $R^{T3}$ independently represents a hydrogen atom, methyl group, ethyl group or propyl group, among which hydrogen atom, methyl group and ethyl group are more preferable.

Each of p and q is preferably 0.

n is preferably 0.

Among the cyclic ether groups (T) represented by Formulae (T-1) to (T-3), those represented by Formula (T-1) and Formula (T-2) are preferable, and those represented by Formula (T-1) are more preferable.

The repeating unit having the cyclic ether group (T) is exemplified by the structures listed below, to which this invention is of course not limited. Each of $R^{41}$, $R^{51}$ and $R^{61}$ independently represents a hydrogen atom or methyl group.

[Chemical Formula 9]

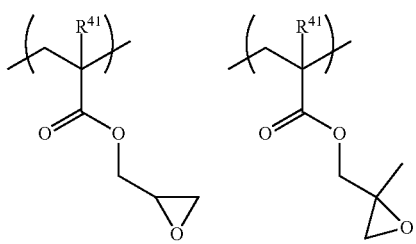

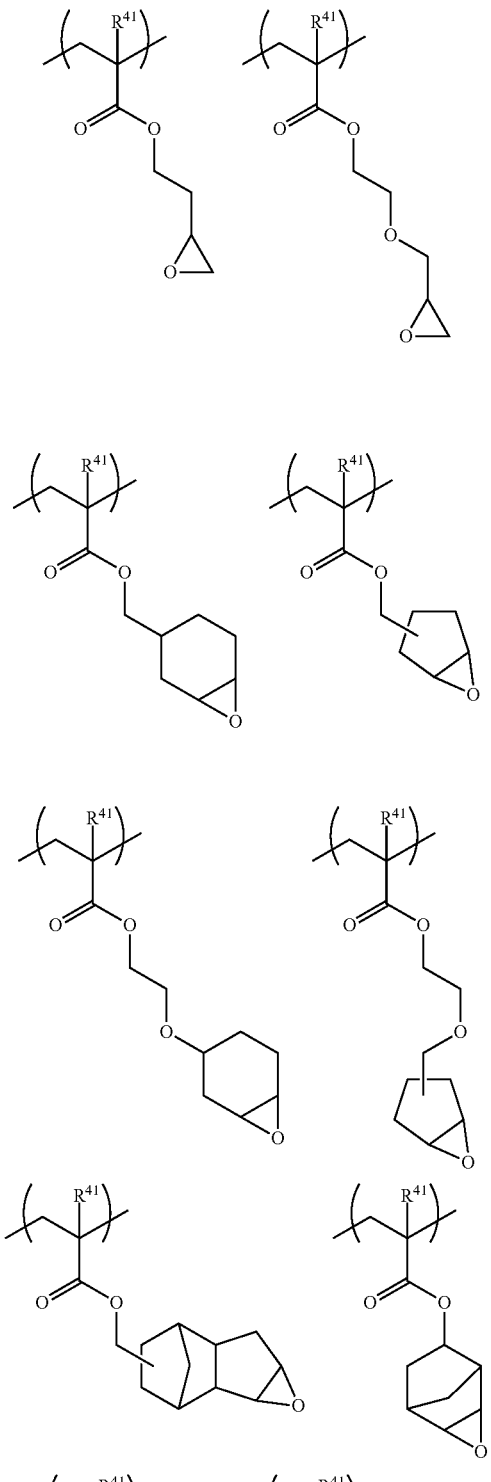

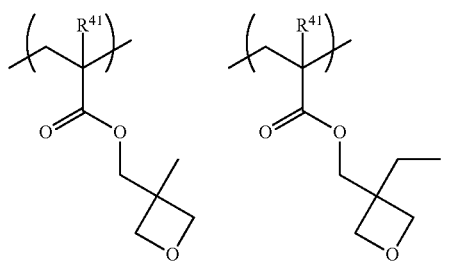

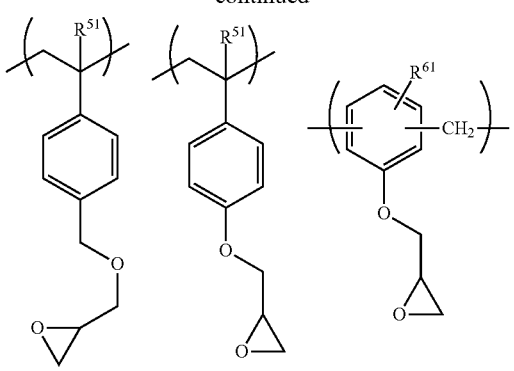

Among the compounds shown above, the compounds below are more preferable.

[Chemical Formula 10]

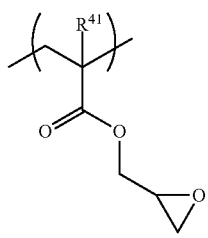
(IV-1)

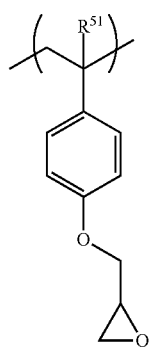
(V-1)

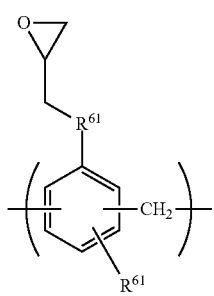
(VI-1)

Other repeating unit which may be possessed by the resin (A) is preferably a repeating unit represented by Formula (VII) and/or Formula (VIII) below.

[Chemical Formula 11]

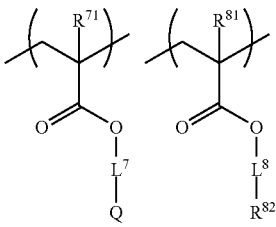

Formula (VII)   Formula (VIII)

(In Formulae (VII) and (VIII), each of $R^{71}$ and $R^{81}$ independently represents a hydrogen atom or methyl group, each of $L^7$ and $L^8$ independently represents a single bond or divalent linking group, Q represents a nonionic hydrophilic group, and $R^{82}$ represents an aliphatic group having 1 to 12 carbon atoms, alicyclic group having 3 to 12 carbon atoms, or aromatic group having 6 to 12 carbon atoms.)

Each of $R^{71}$ and $R^{81}$ independently represents a hydrogen atom or methyl group, and more preferably a methyl group.

Each of $L^7$ and $L^8$ independently represents a single bond or divalent linking group. The divalent linking group is preferably a single bond or alkylene group having 1 to 10 carbon atoms, wherein the alkylene chain may contain at least one of ether bond, ester bond, amide bond and urethane bond, and a hydrogen atom in the alkylene group may be substituted by a hydroxy group.

The number of atoms composing the linking chains represented by $L^7$ and $L^8$ is preferably 1 to 10.

Q represents a nonionic hydrophilic group. The nonionic hydrophilic group (Q) is exemplified by alcoholic hydroxy group, phenolic hydroxy group, ether group (preferably polyoxyalkylene group), amido group, imido group, ureido group, urethane group, and cyano group. Among them, alcoholic hydroxy group, polyoxyalkylene group, ureido group, and urethane group are more preferable; and alcoholic hydroxy group and urethane group are particularly preferable.

$R^{82}$ represents an aliphatic group having 1 to 12 carbon atoms, alicyclic group having 3 to 12 carbon atoms, or aromatic group having 6 to 12 carbon atoms.

The aliphatic group having 1 to 12 carbon atoms is exemplified by alkyl groups having 1 to 12 carbon atoms (for example, methyl group, ethyl group, propyl group, isopropyl group, butyl group, isobutyl group, t-butyl group, pentyl group, isopentyl group, neopentyl group, hexyl group, heptyl group, octyl group, 2-ethylhexylgroup, 3,3,5-trimethylhexyl group, isooctyl group, nonyl group, isononyl group, decyl group, isodecyl group, undecyl group, and dodecyl group).

The alicyclic group having 3 to 12 carbon atoms is exemplified by cycloalkyl groups having 3 to 12 carbon atoms (for example, cyclopentyl group, cyclohexyl group, norbornyl group, isobornyl group, adamantyl group, and tricyclodecanyl group).

The aromatic group having 6 to 12 carbon atoms is exemplified by phenyl group, naphthyl group, and biphenyl group. Among them, phenyl group and naphthyl group are preferable.

While the aliphatic group, the alicyclic group and the aromatic group may have a substituent, they more preferably have no substituent.

In this invention, the resin containing the repeating unit represented by Formula (I) and the repeating unit represented by Formula (IV), the resin containing the repeating unit represented by Formula (II) and the repeating unit represented by Formula (V), and the resin containing the repeating unit represented by Formula (III) and the repeating unit represented by Formula (VI) are preferable; and the resin containing the repeating unit represented by Formula (I-1) and the repeating unit represented by Formula (IV-1), the resin containing the repeating unit represented by Formula (II-1) and the repeating unit represented by Formula (V-1), and the resin containing the repeating unit represented by Formula (III-1) and the repeating unit represented by Formula (VI-1) are more preferable.

Specific examples of the resin (A) used in this invention will be enumerated below. In these specific examples, x represents 5 to 99 mol %, y represents 1 to 95 mol %, and z represents 0 to 30 mol %.

[Chemical Formula 12]

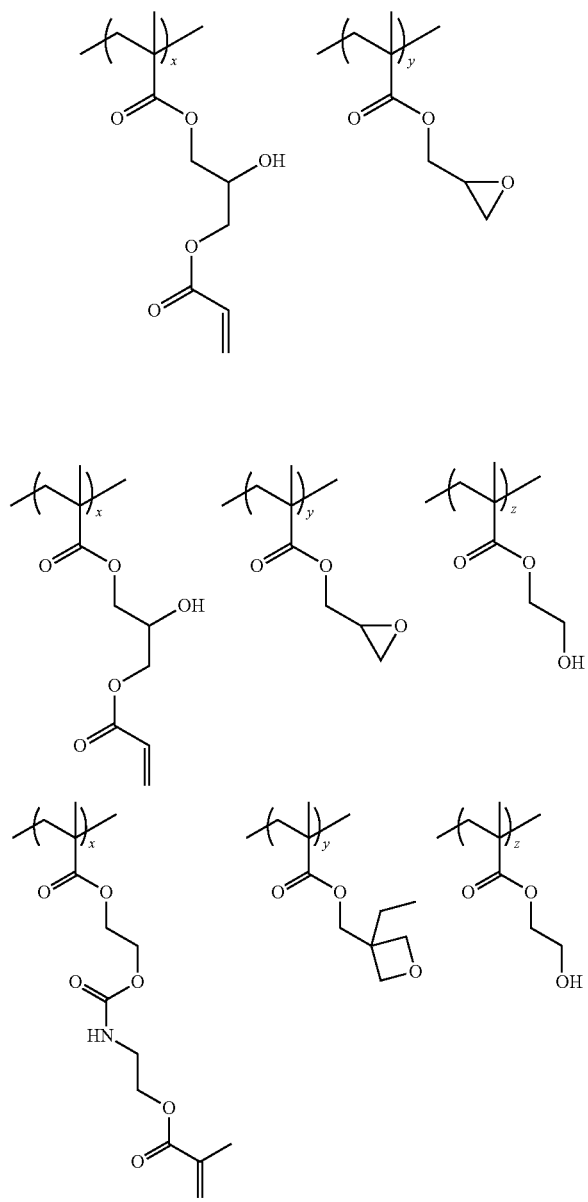

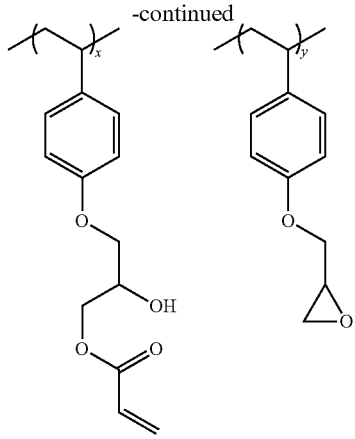

-continued

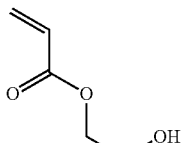

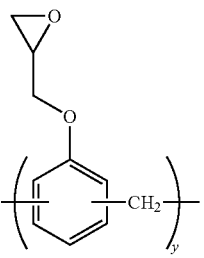

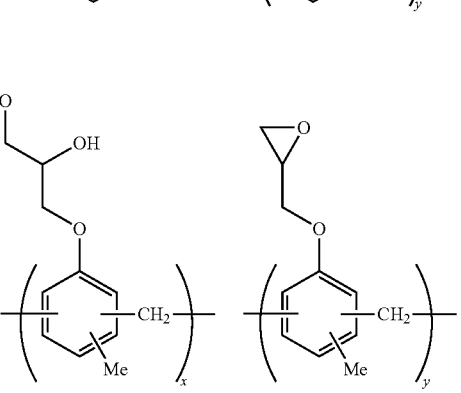

The resin (A) has a weight-average molecular weight (Mw) of 1,000 or larger, preferably 3,000 or larger, and more preferably 5,000 or larger. The upper limit of the weight-average molecular weight (Mw) is preferably 100,000 or smaller, more preferably 50,000 or smaller, and even more preferably 30,000 or smaller. By controlling the molecular weight to be 1,000 or larger, a good film formability will be given.

The content of the resin (A), relative to the total ingredients excluding the solvent, is preferably 50% by mass or more, more preferably 70% by mass or more, even more preferably 90% by mass or more, and particularly 95% by mass or more.

The under layer film-forming composition of the present invention contains the solvent (B). Preferable solvent is such as those having the boiling point at normal pressure in the range from 80 to 200° C. The solvent is arbitrarily selectable from those capable of dissolving therein the under layer film-forming composition, and preferably has at least one of ester group, carbonyl group, hydroxy group and ether group. More specifically, examples of preferable solvent include propylene glycol monomethyl ether acetate (PGMEA), ethoxyethyl propionate, cyclohexanone, 2-heptanone, γ-butyrolactone, butyl acetate, propylene glycol monomethyl ether, and ethyl lactate. Among them, PGEMA, ethoxyethyl propionate and 2-heptanone are more preferable, and PGMEA is particularly preferable. Two or more species of solvent may be used by mixing. Also a mixed solvent of a solvent having a hydroxy group and a solvent having no hydroxy group is preferable.

Content of the solvent in the under layer film-forming composition of the present invention is optimally adjusted depending on viscosity of the composition and a desired thickness of the under layer film. From the viewpoint of good coatability, amount of addition of the solvent is preferably 70% by mass or more of the composition, more preferably 90% by mass or more, furthermore preferably 95% by mass or more, and particularly 99% by mass or more.

In particular, the under layer film-forming composition for imprints of the present invention preferably contains 0.05 to 1.0% by mass in total of the resin (A) and/or resin (A2), and 98.0 to 99.95% by mass of the solvent (B).

The composition for forming underlying layer of this invention preferably contains an acid or acid generator (for example, thermal acid generator or photo-acid generator) (C).

The acid usable for the composition for forming underlying layer of this invention is exemplified by p-toluenesulfonic acid, 10-camphorsulfonic acid, and perfluorobutanesulfonic acid.

The thermal acid generator usable for the composition for forming underlying layer of this invention is exemplified by isopropyl-p-toluenesulfonate, cyclohexyl-p-toluenesulfonate, and aromatic sulfonium salt compound named "San-Aid SI Series" from Sanshin Chemical Industry, Co., Ltd.

The photo-acid generator usable for the composition for forming underlying layer of this invention is preferably sulfonium salt compound, iodonium salt compound or oxime sulfonate compound, and is exemplified by PI2074 from Rhodia Inc., Irgacure 250 from BASF, and Irgacure PAG 103, 108, 121, 203 from BASF.

When the acid or acid generator (for example, thermal acid generator or photo-acid generator) (C) is added to the composition for forming underlying layer of this invention, the amount of addition is preferably 0.0005 to 0.1% by mass, relative to the composition for forming the underlying layer.

In particular, the composition for forming underlying layer of this invention preferably contains 0.05 to 1.0% by mass of (A) resin, 98.0 to 99.95% by mass of (B) solvent, and 0.0005 to 0.1% by mass of (C) acid or acid generator; more preferably contains 0.05 to 0.5% by mass of (A) resin, 99.5 to 99.95% by mass of (B) solvent, and 0.0005 to 0.01% by mass of (C) acid or acid generator; and particularly 0.05 to 0.3% by mass of (A) resin, 99.7 to 99.95% by mass of (B) solvent, and 0.0005 to 0.005% by mass of (C) acid or acid generator.

The under layer film-forming composition of the present invention may contain, as other components, crosslinking agent, acid or acid generator, polymerization inhibitor, or surfactant. Amount of addition of these components is preferably 50% by mass or less of the total components of the under layer film-forming composition, excluding the solvent, more preferably 30% by mass or less, and furthermore preferably 10% by mass or less. It is, however, particularly preferable to contain substantially no other components. The expression of "to contain substantially no other components" herein means that the other components are not intentionally added to the under layer film-forming composition, except for, for example, additives such as a reactant, catalyst and polymerization inhibitor used for synthesizing the resin (A), and impurities derived from reaction by-products. More specifically, the content may be 5% by mass or less.

Crosslinking Agent

The crosslinking agent is preferably selectable from cation-polymerizable compounds such as epoxy compound, oxetane compound, methylol compound, methylol ether compound, and vinyl ether compound.

Examples of the epoxy compound include Epolite from Kyoeisha Chemical Co. Ltd.; Denacol EX from Nagase chemteX Corporation; EOCN, EPPN, NC, BREN, GAN, GOT, AK and RE Series from Nippon Kayaku Co. Ltd.; Epicoat from Japan Epoxy Resins Co. Ltd.; Epiclon from DIC Corporation; and Tepic Series from Nissan Chemical Industries, Ltd. Two or more species of them may be used in combination.

The oxetane compound is exemplified by Eternacoll OXBP, OXTP and OXIPA from Ube Industries Ltd.; and ARON oxetane OXT-121 and OXT-221 from Toagosei Co. Ltd.

The vinyl ether compound is exemplified by Vectomer Series from Allied Signal, Inc.

The methylol compound and methylol ether compound are exemplified by urea resin, glycouril resin, melamine resin, guanamine resin, and phenol resin. Specific examples include Nikalac MX-270, MX-280, MX-290, MW-390 and BX-4000 from Sanwa Chemical Co. Ltd; and Cymel 301, 303ULF, 350 and 1123 from Cytec Industries Inc.

Polymerization Inhibitor

The under layer film-forming composition of the present invention preferably contains a polymerization inhibitor, from the viewpoint of shelf stability. Examples of the polymerization inhibitor usable in the present invention include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), N-nitrosophenylhydroxyamine cerium (I) salt, phenothiazine, pheoxazine, 4-methoxynaphthol, 2,2,6,6-tetramethylpiperidine-1-oxyl, free radical, 2,2,6,6-tetramethylpiperidine, 4-hydroxy-2,2,6,6-tetramethylpiperidine-1-oxyl, free radical, nitrobenzene, and dimethylaniline. Among them, phenothiazine, 4-methoxynaphthol, 2,2,6,6-tetramethylpiperidine-1-oxyl, free radical, 2,2,6,6-tetramethylpiperidine, and 4-hydroxy-2,2,6,6-tetramethylpiperidine-1-oxyl, free radical are preferable, since they exhibit effects even under an anaerobic condition.

Surfactant

The under layer film-forming composition for imprints of the present invention may contain a surfactant. The surfactant is preferably a nonionic surfactant, and is preferably any of fluorine-containing, Si-based, and fluorine-containing/Si-based ones. The expression of "fluorine-containing/Si-based" means that the surfactant has features of both of fluorine-containing and Si-based surfactants. By using this sort of surfactant, uniformity of coating may be improved, and a good coated film may be obtained by coating using a spin coater or slit scan coater.

The nonionic surfactant usable in the present invention is exemplified by various series under the trade names of Fluorad (from Sumitomo 3M Ltd.), Megafac (from DIC Corporation), Surflon (from AGC Seimi Chemical Co. Ltd.), Unidyne (from Daikin Industries Ltd.), Ftergent (from NEOS Co. Ltd.), Eftop (from Mitsubishi Material Electronic Chemicals Co. Ltd.), Polyflow (from Kyoeisha Chemical Co. Ltd.), KP (from Shin-Etsu Chemical Co. Ltd.), Troysol (from Troy Chemical Industries), PolyFox (From OMNOVA Solutions Inc.), and Capstone (from DuPont).

The under layer film-forming composition of the present invention may be prepared by mixing the individual components described above. After mixing of the individual components, the mixture is preferably filtered through a filter with a pore size of 0.003 µm to 5.0 µm. The filtration may be conducted in a multi-step manner or may be repeated plural times. Filter media usable for the filtration include polyethylene resin, polypropylene resin, fluorine-containing resin and nylon resin, but not limited thereto.

<Curable Composition for Imprints>

The curable composition for imprints used together with the under layer film-forming composition of the present invention generally contains a polymerizable compound and a polymerization initiator.

Polymerizable Compound

Species of the polymerizable compound used for the curable composition for imprints used in the present invention is not specifically limited without departing from the spirit of the present invention, and is exemplified by polymerizable unsaturated monomer having 1 to 6 groups containing an ethylenic unsaturated linking groups; epoxy compound; oxetane compound; vinyl ether compound; styrene derivative; and propenyl ether and butenyl ether. The curable composition for imprints preferably has a polymerizable group which is polymerizable with the polymerizable group contained in the under layer film-forming composition of the present invention. Among them, (meth)acrylate is preferable. Specific examples of them are exemplified by those described in paragraphs [0020] to [0098] of JP-A-2011-231308, the contents of which are incorporated by reference into this patent specification.

The polymerizable compound preferably contains a polymerizable compound having an alicyclic hydrocarbon group and/or aromatic group, and more preferably contains a polymerizable compound having an alicyclic hydrocarbon group and/or aromatic group, and a polymerizable compound having a silicon atom and/or fluorine atom. Of the whole polymerizable components contained in the curable composition for imprints of the present invention, the total content of the polymerizable compounds having an alicyclic hydrocarbon group and/or aromatic group preferably accounts for 30 to 100% by mass of the total polymerizable compounds, more preferably 50 to 100% by mass, and furthermore preferably 70 to 100% by mass. The molecular weight of the polymerizable compound is preferably not more than 1000.

In a further preferable embodiment, a (meth)acrylate polymerizable compound having an aromatic group, used as the polymerizable compound, preferably accounts for 50 to 100% by mass of the total polymerizable components, more preferably 70 to 100% by mass, and furthermore preferably 90 to 100% by mass.

In a particularly preferable embodiment, a polymerizable compound (1) described below accounts for 0 to 80% by mass (more preferably 20 to 70% by mass) of the total polymerizable components, a polymerizable compound (2) described below accounts for 20 to 100% by mass (more preferably 50 to 100% by mass) of the total polymerizable components, and a polymerizable compound (3) described below accounts for 0 to 10% by mass (more preferably 0.1 to 6% by mass) of the total polymerizable components:

(1) polymerizable compound having an aromatic group (preferably phenyl group or naphthyl group, and more preferably naphthyl group) and a (meth)acrylate group;

(2) polymerizable compound having an aromatic group (preferably phenyl group or naphthyl group, and more preferably phenyl group), and two (meth)acrylate groups; and (3) polymerizable compound having at least either of a fluorine atom and silicon atom, and a (meth)acrylate group.

In the curable composition for imprints, content of the polymerizable compound having a viscosity at 25° C. of smaller than 5 mPa·s is preferably 50% by mass or less of the total polymerizable compounds, more preferably 30% by mass or less, and furthermore preferably 10% by mass or less. By adjusting the content in the ranges described above, ink-jetting stability may be improved, and thereby defects in transfer-by-imprint may be reduced.

Polymerization Initiator

The curable composition for imprints used in the present invention contains a photo-polymerization initiator. The photo-polymerization initiator used in the present invention is arbitrarily selectable from those generating an active species capable of polymerizing the above-described polymerizable compounds under photo-irradiation. The photo-polymerization initiator is preferably a radical polymerization initiator or cation polymerization initiator, and more preferably a radical polymerization initiator. In the present invention, two or more species of the photo-polymerization initiator may be used in combination.

The radical photo-polymerization initiator used in the present invention is selectable typically from those commercially available. Those described for example in paragraph [0091] of JP-A-2008-105414 may preferably be used. Among them, acetophenone-based compound, acylphosphine oxide-based compound, and oxim ester-based compound are preferable from the viewpoints of curing sensitivity and absorption characteristics. As a commercial products, Irgacure907 manufactured from BASF is exemplified.

In the present invention, "light" includes not only those in the wavelength regions of UV, near-UV, deep-UV, visible light and infrared, and other electromagnetic waves, but also radiation ray. The radiation ray includes microwave, electron beam, EUV and X-ray. Also laser light such as 248 nm excimer laser, 193 nm excimer laser, and 172 nm excimer laser are usable. These sorts of light may be monochromatic light obtained after being passed through an optical filter, or may be composite light composed of a plurality of light components with different wavelengths.

Content of the photo-polymerization initiator used in the present invention is typically 0.01 to 15% by mass of the whole composition but excluding the solvent, preferably 0.1 to 12% by mass, and more preferably 0.2 to 7% by mass. When two or more species of photo-polymerization initiator are used, the total content falls in the above-described ranges.

If the content of the photo-polymerization initiator is 0.01% by mass or more, there will be preferable trends of improvement in sensitivity (fast curability), resolution, line edge roughness, and film strength. On the other hand, if the content of the photo-polymerization initiator is 15% by mass or less, there will be preferable trends of improvement in translucency, coloration and handleability.

Surfactant

The curable composition for imprints used in the present invention preferably contains a surfactant. The surfactant used in the present invention is exemplified by those used in the under layer film-forming composition as described above. Content of the surfactant used in the present invention is typically 0.001 to 5% by mass of the whole composition, preferably 0.002 to 4% by mass, and furthermore preferably 0.005 to 3% by mass. When two or more species of surfactant are used, the total content falls in the above-described ranges. If the content of the surfactant falls in the range from 0.001 to 5% by mass of the composition, an effect on uniformity of coating will be good, and degradation in mold transfer characteristics due to excessive surfactant will be less likely to occur.

The surfactant is preferably a nonionic surfactant, preferably contains at least one of fluorine-containing surfactant, Si-based surfactant and fluorine-containing/Si-based surfactant, more preferably contains both of the fluorine-containing surfactant and the Si-based surfactant, or, the fluorine-containing/Si-based surfactant, and most preferably contains the fluorine-containing/Si-based surfactant. Note that the fluorine-containing surfactant and the Si-based surfactant are preferably nonionic surfactants.

The "fluorine-containing/Si-based" means that the surfactant has features of both of fluorine-containing and Si-based surfactants.

By using this sort of surfactant, it is now able to solve problems regarding coating failure such as striation or scaly pattern (non-uniform drying of resist) which possibly occur when the curable composition for imprints is coated over a silicon wafer for manufacturing semiconductor device, glass square substrate for manufacturing liquid crystal display device, and substrates having formed thereon various films including chromium film, molybdenum film, molybdenum alloy film, tantalum film, tantalum alloy film, silicon nitride film, amorphous silicon film, tin oxide doped indium oxide (ITO) film, and tin oxide film. In particular, the under layer film-forming composition of the present invention added with the surfactant may largely be improved in the uniformity of coating, and may achieve appropriate coating characteristics in coating using a spin coater or slit scan coater, irrespective of the size of substrate.

Examples of the surfactant usable in the present invention may be referred to paragraph [0097] of JP-A-2008-105414, the content of which is incorporated by reference into this patent specification. The surfactant is also commercially available, typically under the trade name of PF-636 (from OMNOVA Solutions Inc.).

Non-Polymerizable Compound

The curable composition for imprints used in the present invention may contain a non-polymerizable compound which has, at the terminal thereof, at least one hydroxy group or a polyalkylene glycol structure formed by etherifying the hydroxy group, and contains substantially no fluorine atom and silicon atom.

Content of the non-polymerizable compound is preferably 0.1 to 20% by mass of the whole composition excluding the solvent, more preferably 0.2 to 10% by mass, still more preferably 0.5 to 5% by mass, and furthermore preferably 0.5 to 3% by mass.

Antioxidant

Preferably, the curable composition for imprints used in the invention contains a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (manufactured from BASF GmbH); Antigene P, 3C, FR, Sumilizer S, Sumilizer GA80 (manufactured from Sumitomo Chemical); Adekastab AO70, AO80, AO503 (manufactured from Adeka), etc. These may be used either singly or as combined.

Polymerization Inhibitor

Furthermore, the curable composition for imprints used in the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount. The polymerization inhibitor may be added at the production of the polymerizable monomer or may be added the curable composition for imprints after the production of the polymerizable monomer.

Preferable examples of the polymerization inhibitor usable in the present invention may be referred to the description in paragraph [0125] of JP-A-2012-094821, the content of which is incorporated by reference into this patent specification.

Solvent

A solvent may be used for the curable composition for imprints used in the invention, in accordance with various needs. In particular, when a pattern having a thickness of at most 500 nm is formed, the composition preferably contains a solvent. Preferably, the solvent has a boiling point at normal pressure of from 80 to 200° C. Regarding the type of the solvent, any solvent capable of dissolving the composition may be used. Preferred are solvents having at least any one of an ester structure, a ketone structure, a hydroxyl group and an ether structure. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the composition for imprints used in the present invention may be suitably optimized depending on the viscosity of the constitutive ingredients except the solvent, the coatability of the composition and the intended thickness of the film to be formed. From the viewpoint of the coatability, the solvent content is preferably from 0 to 99% by mass of the composition. When the composition for imprints used in the present invention is applied onto the substrate by inkjet method, it is preferred that the composition does not substantially contain a solvent (for example 3% by mass or less, preferably 1% by mas or less). On the other hand, when a pattern having a film thickness of 500 nm or less is formed by spin-coating method or the like, the content may be 20 to 99% by mass, preferably 40 to 99% by mass, specifically preferably 70 to 98% by mass.

Polymer Ingredient

The curable composition for imprints used in the invention may contain a poly-functional oligomer having a larger molecular weight than that of the above-mentioned, other poly-functional monomer within a range capable of attaining the object of the invention, for the purpose of further increasing the crosslinking density of the composition. Examples of the photoradical-polymerizable poly-functional oligomer include various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The curable composition for imprints for imprints used in the present invention may further contain a polymer component, in view of improving the dry etching resistance, imprint suitability and curability. The polymer component preferably has a polymerizable functional group in the side chain thereof. Weight-average molecular weight of the polymer component is preferably 2,000 to 100,000, and more preferably 5,000 to 50,000, in view of compatibility with the polymerizable monomer. Amount of addition of the polymer component, with respect to portion of the composition excluding the solvent, is preferably 0 to 30% by mass, more preferably 0 to 20% by mass, and most preferably 2% by mass or less. Pattern formability may be improved by adjusting the content of polymer component having a molecular weight of 2,000 or larger, with respect to the portion of the curable composition for imprints of the present invention excluding the solvent. From the viewpoint of pattern formability, as least as possible amount of resin component is preferable, and therefore the curable composition preferably contains no polymer component other than those composing the surfactant or trace amounts of additives.

In addition to the above-mentioned ingredients, the curable composition for imprints used in the invention may contain, if desired, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

The curable composition for imprints of the present invention may be prepared by mixing the individual components described in the above. Mixing and dissolution are generally proceeded in the temperature range from 0 to 100° C.

The curable composition prepared by mixing the individual components is preferably filtered, typically through a filter with a pore size of 0.003 µm to 5.0 µm, and more preferably 0.01 to 1.0 µm. The filtration may be proceeded in a multi-stage manner, or may be repeated a large number of times. The filtrate may be re-filtered. Material for composing a filter used for filtration may be polyethylene resin, polypropylene resin, fluorine-containing resin, nylon resin or the like, but not specifically limited.

In the curable composition for imprints used in the present invention, a mixture of the total components excluding the solvent preferably has a viscosity of 100 mPa·s or smaller, more preferably 1 to 70 mPa·s, furthermore preferably 2 to 50 mPa·s, and most preferably 3 to 30 mPa·s.

The curable composition for imprints used in the present invention after manufacturing is bottled in containers such as gallon bottles or coated bottles, and transported or stored. In this case, the inner space of the containers may be replaced with an inert gas such as nitrogen or argon, for the purpose of preventing deterioration. While the curable composition for imprints may be transported or stored at normal temperature, it is also preferable to control the temperature in the range from −20° C. to 0° C. for the purpose of preventing denaturation. Of course, the curable composition for imprints may be shielded from light up to a level of suppressing the reaction from proceeding.

In permanent films (resists for structural members) for use in liquid-crystal displays (LCD) and in resists for use for substrate processing for electronic materials, the resist is preferably prevented from being contaminated as much as possible with metallic or organic ionic impurities in order that the resist does not interfere with the performance of the products. Accordingly, the concentration of the metallic or organic ionic impurities in the curable composition for imprints of the invention is preferably at most 1 ppm, more preferably at most 100 ppb, even more preferably at most 10 ppb.

<Method for Film Making>

The under layer film-forming composition of the present invention is applied onto a substrate to form the under layer film. Methods of application onto the substrate include dip coating, air knife coating, curtain coating, wire bar coating, gravure coating, extrusion coating, spin coating, slit scan coating, and ink jet coating, by which a coated film or droplets may be formed on the substrate. Coating is preferable from the viewpoint of uniformity of film thickness, and spin coating is more preferable. The solvent is dried off thereafter. The drying temperature is preferably 70° C. to 130° C. The drying is preferably followed by curing through activation energy (preferably heat and/or light). Curing under heating at 150° C. to 250° C. is preferable. The process of drying off the solvent and the process of curing may be proceeded at the same time. As described above, in the present invention, it is preferable to apply the under layer film-forming composition, followed by curing of a part of the under layer film-forming composition through heat or photo-irradiation, and further followed by application of the composition for imprints. By employing the technique, also the under layer film-forming composition is thoroughly cured in the process of photo-curing of the curable composition for imprints, and thereby the adhesiveness will be more likely to improve.

<Substrate>

Substrate (wafer or support) on which the under layer film-forming composition of the present invention is coated is selectable, depending on a variety of applications, typically from quartz, glass, optical film, ceramic material, evaporated film, magnetic film, reflective film, metal substrate composed of Ni, Cu, Cr or Fe, paper, SOC (Spin On Carbon), SOG (Spin On Glass), polymer substrates composed of polyester film, polycarbonate film or polyimide film, TFT array substrate, electrode substrate of PDP, glass or translucent plastic substrate, electro-conductive substrate composed of ITO or metal, and substrates used in semiconductor process such as insulating substrate, silicon, silicon nitride, polysilicon, silicon oxide or amorphous silicon, without special limitation. In the present invention, an appropriate under layer film may be formed particularly when a substrate having a small surface energy (for example, 40 to 60 mJ/m² or around) is used. Nevertheless, when the substrate is intended to be etched, a substrate used for semiconductor process is preferably used as described later.

A patterned laminate composed of the substrate, the under layer film and the curable composition for imprints of the present invention may be used as an etching resist. The substrate in this case is exemplified by those (silicon wafer) having formed thereon a film of SOC (Spin On Carbon), SOG (Spin On Glass), $SiO_2$ or silicon nitride.

Multiple etching onto a substrate may be carried out at the same time. A laminate composed of the substrate, the under layer film and the curable composition for imprints of the present invention is less causative of film separation, and is therefore useful, even under environmental changes or stress applied thereto, when used as a permanent film in devices or structures, in an intact form, or in a form obtained after removing any residual film in recessed portions or removing the under layer film.

In the present invention, in particular, a substrate having a polar group on the surface thereof is preferably used. By using the substrate having a polar group on the surface thereof, the adhesiveness with the under layer film-forming composition tends to improve more effectively. The polar group is exemplified by hydroxy group, carboxy group, and silanol group. Silicon substrate and quartz substrate are particularly preferable.

Geometry of the substrate is not specifically limited, and may be in a sheet form or rolled form. The substrate is also selectable from those of translucent and non-translucent types, depending on combination with the mold, as described later.

<Process>

The method for forming a fine pattern of this invention includes coating the above-described composition for forming underlying layer for imprints, over a substrate; forming an underlying layer, by curing the coated composition for forming underlying layer for imprints; coating a photo-curable composition for imprints over the underlying layer; pressing thereto a mold with a fine pattern; curing the photo-curable composition for imprints by photo-irradiation, while keeping it pressed under the mold; and releasing the mold. It is further preferable that the method includes coating the composition for forming the underlying layer over the substrate, allowing the composition for forming underlying layer of this invention to partially cure by heating or photo-irradiation, and then coating the photo-curable composition for imprints. In particular in this invention, the step of curing the composition for forming underlying layer for imprints in order to form the underlying layer may be implemented by heat curing at 120 to 160° C., by which the underlying layer which demonstrates a large adhesiveness to the layer to be imprinted, has a good surface flatness, and, is less likely to cause the separation failure when the layer to be imprinted is released from a mold, may be formed.

The under layer film-forming composition of the present invention is preferably 1 to 10 nm thick as applied (for example, thickness of coated film), and more preferably 2 to 7 nm thick. The thickness of the film after cured is preferably 1 to 10 nm, and more preferably 2 to 7 nm.

FIG. 1 is a schematic drawing illustrating an exemplary manufacturing process when the curable composition for imprints is used for working of a substrate by etching, wherein reference numeral 1 stands for the substrate, 2 stands for the under layer film, 3 stands for the curable composition for imprints, and 4 stands for the mold. In FIG. 1, the under layer film-forming composition 2 is applied onto the surface of the substrate 1 (2), the curable composition for imprints 3 is applied onto the surface (3), and the mold is applied onto the surface thereof (4). After the photo-irradiation, the mold is separated (5). The laminate is etched according to a pattern formed by the curable composition for imprints (6), the curable composition for imprints 3 and the under layer film-forming composition 2 are separated, to thereby form the substrate with a desired pattern formed thereon (7). The adhesiveness between the substrate 1 and the curable composition for imprints 3 is important, since a poor level of the adhesiveness will fail in exactly transferring the pattern of the mold 4.

More specifically, the method for forming a pattern according to the present invention includes applying the under layer film-forming composition for imprints of the present invention onto the substrate to thereby form the under layer film; and applying the curable composition for imprints onto the under layer film. The method further preferably includes, after applying the under layer film-forming composition for imprints of the present invention onto the substrate, allowing a part of the under layer film-forming composition for imprints to cure through heat or photo-irradiation, and applying thereon the curable composition for imprints. In general, the method includes irradiating light onto the curable composition for imprints and the under layer layer, while holding them between the substrate and a mold with fine patterns to thereby cure the curable composition for imprints, and separating the mold. Details of the method will be described below.

Methods of applying the under layer film-forming composition and the curable composition for imprints of the present invention are respectively selectable from those publicly well known.

The methods of application in the present invention are exemplified by dip coating, air knife coating, curtain coating, wire bar coating, gravure coating, extrusion coating, spin coating, slit scan coating, or ink jet coating, by which a coated film or droplets may be formed on the substrate or on the under layer film. Thickness of the pattern forming layer composed of the curable composition for imprints of the present invention is 0.03 µm to 30 µm or around, which may vary depending on purpose of use. The curable composition for imprints may be coated by multiple coating. In the method for placing droplets on the under layer film typically by ink jet coating, volume of each droplet is preferably 1 pl to 20 pl. The droplets are preferably arranged on the under layer film while keeping a space in between.

Next, in the patterning method of the invention, a mold is pressed against the surface of the patterning layer for transferring the pattern from the mold onto the patterning layer. Accordingly, the micropattern previously formed on the pressing surface of the mold is transferred onto the patterning layer.

Alternatively, the composition for imprints may be coated over the mold having a pattern formed thereon, and the under layer film may be pressed thereto.

The mold material usable in the invention is described. In the photoimprint lithography with the composition for imprints of the invention, a light-transmissive material is selected for at least one of the mold material and/or the substrate. In the photoimprint lithography applied to the invention, the curable composition for imprints of the invention is applied onto a substrate to form a patterning layer thereon, and a light-transmissive mold is pressed against the surface of the layer, then this is irradiated with light from the back of the mold and the patterning layer is thereby cured. Alternatively, the curable composition for photoimprints is applied onto a light-transmissive substrate, then a mold is pressed against it, and this is irradiated with light from the back of the substrate whereby the curable composition for photoimprints can be cured.

The photoirradiation may be attained while the mold is kept in contact with the layer or after the mold is released. In the invention, preferably, the photoirradiation is attained while the mold is kept in contact with the patterning layer.

The mold usable in the present invention has a pattern to be transferred. The pattern on the mold may be formed with a desired level of processing accuracy, typically by photolithography, electron beam lithography and so forth. Methods of forming the pattern on the mold is not specifically limited in the present invention. Also a pattern formed by the method for forming a pattern according to the present invention may be used as a mold.

Not specifically defined, the light-transmissive mold material for use in the invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold to be used in the invention where a light-transmissive substrate is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold for use in the patterning method of the invention may be processed for surface release treatment for the purpose of enhancing the releasability of the curable composition for imprints from the mold. The mold of the type includes those surface-treated with a silicone-type or fluorine-containing silane coupling agent, for which, for example, commercial release agents such as Daikin's Optool DSX, Sumitomo 3M's Novec EGC-1720 and others are preferred.

In photoimprint lithography with the curable composition for imprints, in general, the mold pressure in the patterning method of the invention is preferably at most 10 atmospheres. When the mold pressure is at most 10 atmospheres, then the mold and the substrate are hardly deformed and the patterning accuracy tends to increase. It is also favorable since the pressure unit may be small-sized since the pressure to be given to the mold may be low. The mold pressure is preferably selected from the region capable of securing the mold transfer uniformity, within a range within which the residual film of the curable composition for imprints in the area of mold pattern projections may be reduced.

In the patterning method of the invention, the dose of photoirradiation in the step of irradiating the patterning layer with light may be sufficiently larger than the dose necessary for curing. The dose necessary for curing may be suitably determined depending on the degree of consumption of the unsaturated bonds in the curable composition for imprints and on the tackiness of the cured film as previously determined.

In the imprint lithography applied to the present invention, photo-irradiation is conducted while keeping the substrate temperature generally at room temperature, wherein the photo-irradiation may alternatively be conducted under heating for the purpose of enhancing the reactivity. Also photo-irradiation in vacuo is preferable, since a vacuum conditioning prior to the photo-irradiation is effective for preventing entrainment of bubbles, suppressing the reactivity from being reduced due to incorporation of oxygen, and for improving the adhesiveness between the mold and the curable composition for imprints. In the method for forming a pattern according to the present invention, the degree of vacuum in the process of photo-irradiation is preferably in the range from $10^{-1}$ Pa to normal pressure.

Light to be used for photoirradiation to cure the curable composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as γ rays, X rays, α rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 50 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer (a layer comprising the curable composition for imprints layer) is cured through photoirradiation, if desired, the cured pattern may be further cured under heat given thereto. The method may additionally includes the post-curing step. Thermal curing of the composition of the invention after photoirradiation is preferably attained at 150 to 280° C., more preferably at 200 to 250° C. The heating time is preferably from 5 to 60 minutes, more preferably from 15 to 45 minutes.

EXAMPLE

This invention will further be detailed below referring to Examples. Materials, amounts of consumption, ratios, details of processes, and procedures of processes described in Examples below may be modified suitably, without departing from the spirit of this invention. The scope of this invention is therefore by no means interpreted limitatively by Examples described below.

Notation of "-co-" in the names of polymers indicates that the sequences of monomer units in the polymers are not specified.

Synthesis of Resin A-1

Poly[(phenylglycidyl ether)-co-formaldehyde] (Mn=570, from Sigma-Aldrich Co. LLC.) (64.9 g) was dissolved into 150 g of propylene glycol monomethyl ether acetate (PGEMA).

To the solution, β-carboxyethyl acrylate (from Wako Pure Chemical Industries, Ltd.) (51.9 g), tetraethylammonium bromide (TBAB, from Wako Pure Chemical Industries, Ltd.) (2.1 g), and 4-hydroxy-tetramethylpiperidine-1-oxyl (4-HO-TEMPO, from Wako Pure Chemical Industries, Ltd.) (50 mg) were added, and the mixture was allowed to react at 90° C. for 10 hours. The obtained Resin A-1 was found to be characterized by Mw=1500. The molar ratio of acryloyloxy group and glycidyl group, determined from the ratio of peak areas in $^1$H-NMR, was found to be 90:10.

Synthesis of Resin A-2

Poly[(o-cresylglycidyl ether)-co-formaldehyde] (Mn=1080, from Sigma-Aldrich Co. LLC.) (70.5 g) was dissolved into PGEMA (150 g).

To the solution, acrylic acid (AA, from Wako Pure Chemical Industries, Ltd.) (23.1 g), TBAB (2.1 g), and 4-HO-TEMPO (50 mg) were added, and the mixture was allowed to react at 90° C. for 10 hours. The obtained Resin was found to be characterized by Mw=2800. The molar ratio of acryloyloxy group and glycidyl group, determined from the ratio of peak areas in $^1$H-NMR, was found to be 80:20.

Synthesis of Resin A-3

Poly(p-hydroxystyrene) (Mw=3500, Mw/Mn=1.4, VP-2500, from Nippon Soda Co., Ltd) (48.1 g), potassium t-butoxide (from Wako Pure Chemical Industries, Ltd.) (47.1 g), and t-butanol (from Wako Pure Chemical Industries, Ltd.) (1000 g) were mixed.

While keeping the solution at 40° C., epichlorohydrin (from Wako Pure Chemical Industries, Ltd.) (38.9 g) was slowly added dropwise, and the mixture was allowed to react at 40° C. for 24 hours. After completion of the reaction, the mixture was condensed, PGMEA (300 g) was added thereto, and the deposited salt was removed by filtration.

To the filtrate, AA (23.1 g), TBAB (2.1 g) and 4-HO-TEMPO (50 mg) were added, and the mixture was allowed to react at 90° C. for 10 hours. The obtained Resin A-X was found to be characterized by Mw=8000, and dispersity (Mw/Mn)=1.6. The molar ratio of acryloyloxy group and glycidyl group, determined from the ratio of peak areas in $^1$H-NMR, was found to be 80:20.

Synthesis of Resin A-6

In a flask, PGMEA (100 g) was placed, and the content was heated to 90° C. under a nitrogen atmosphere. To the solvent, added dropwise was a mixed solution of glycidyl methacrylate (GMA, from Wako Pure Chemical Industries, Ltd.) (56.9 g), 2,2'-azobis(methyl 2-methylpropanoate) (V-601, from Wako Pure Chemical Industries, Ltd.) (3.7 g) and PGMEA (50 g), over 2 hours. After the dropwise addition, the mixture was further stirred at 90° C. for 4 hours, to thereby obtain a PGMEA solution of GMA polymer.

To the solution of GMA polymer, AA (23.1 g), TBAB (2.1 g) and 4-HO-TEMPO (50 mg) were added, and the mixture was allowed to react at 90° C. for 10 hours. The obtained Resin A-5 was found to be characterized by Mw=14000, and dispersity (Mw/Mn)=2.0. The molar ratio of acryloyloxy group and glycidyl group, determined from the ratio of peak areas in $^1$H-NMR, was found to be 80:20.

Synthesis of Resin A-4

Resin A-4 was synthesized in the same way as in Exemplary Synthesis of Resin A-6, except that the amount of addition of acrylic acid was varied to 28.0 g. The obtained Resin A-4 was found to be characterized by Mw=14900 and dispersity (Mw/Mn)=2.1. The molar ratio of acryloyloxy group and glycidyl group, determined from the ratio of peak areas in $^1$H-NMR, was found to be 97:3.

Synthesis of Resin A-5

Resin A-5 was synthesized in the same way as in Exemplary Synthesis of Resin A-6, except that the amount of addition of acrylic acid was varied to 26.0 g. The obtained Resin A-4 was found to be characterized by Mw=14500, and dispersity (Mw/Mn)=2.1. The molar ratio of acryloyloxy group and glycidyl group, determined from the ratio of peak areas in $^1$H-NMR, was found to be 90:10.

Synthesis of Resin A-7

Resin A-7 was synthesized in the same way as in Exemplary Synthesis of Resin A-6, except that the amount of addition of acrylic acid was varied to 14.4 g. The obtained Resin A-7 was found to be characterized by Mw=12500, and dispersity (Mw/Mn)=2.0. The molar ratio of acryloyloxy group and glycidyl group, determined from the ratio of peak areas in $^1$H-NMR, was found to be 50:50.

Synthesis of Resin A-8

Resin A-8 was synthesized in the same way as in Exemplary Synthesis of Resin A-6, except that the amount of addition of V-601 was varied to 7.4 g. The obtained Resin A-8 was found to be characterized by Mw=7200, and dispersity (Mw/Mn)=2.0. The molar ratio of acryloyloxy group and glycidyl group, determined from the ratio of peak areas in $^1$H-NMR, was found to be 80:20.

Synthesis of Resin A-9

Resin A-9 was synthesized in the same way as in Exemplary Synthesis of Resin A-6, except that the amount of addition of V-601 was varied to 2.3 g. The obtained Resin A-9 was found to be characterized by Mw=31200, and dispersity (Mw/Mn)=2.5. The molar ratio of acryloyloxy group and glycidyl group, determined from the ratio of peak areas in $^1$H-NMR, was found to be 80:20.

Synthesis of Resin A-10

In a flask, PGMEA (100 g) was placed as a solvent, and the content was heated to 90° C. under a nitrogen atmosphere. To the solvent, added dropwise was a mixed solution of GMA (45.5 g), 2-hydroxyethyl methacrylate (HEMA, from Wako Pure Chemical Industries, Ltd.) (10.4 g), V-601 (5.2 g), PGMEA (50 g), over 2 hours. After the dropwise addition, the mixture was further stirred at 90° C. for 4 hours, to thereby obtain a GMA/HEMA copolymer.

To the solution of GMA/HEMA copolymer, AA (17.3 g), TBAB (2.1 g) and 4-HO-TEMPO (50 mg) were added, and the mixture was allowed to react at 90° C. for 10 hours. The obtained Resin A-9 was found to be characterized by Mw=8900, and dispersity (Mw/Mn)=1.9. The molar ratio of acryloyloxy group, glycidyl group and hydroxyethyl group, determined from the ratio of peak areas in $^1$H-NMR, was found to be 60:20:20.

Synthesis of Resin A-11

In a flask, PGMEA (100 g) was placed as a solvent, and the content was heated to 90° C. under a nitrogen atmosphere. To the solvent, added dropwise was a mixed solution of 3-ethyl-3-oxetanylmethyl methacrylate (OXE-30, from Osaka Organic Chemical Industry, Ltd.) (29.5 g), HEMA (31.2 g), V-601 (4.6 g) and PGMEA (50 g), over 2 hours. After the dropwise addition, the mixture was further stirred at 90° C. for 4 hours, to thereby obtain an OXE-30/HEMA copolymer.

To the solution of OXE-30/HEMA copolymer, 2-methacryloyloxyethyl isocyanate (MOI, from Showa Denko K.K.) (31.0 g) and dibutyltin dilaurate (0.04 g) were added, and the mixture was allowed to react at 60° C. for 24 hours to thereby obtain a PGMEA solution of Resin A-10. The obtained Resin A-10 was found to be characterized by Mw=15500 and dispersity (Mw/Mn)=2.2. The molar ratio of methacrylate group, oxetanyl group and hydroxyethyl group, determined from the ratio of peak areas in $^1$H-NMR, was found to be 50:40:10.

Structures of Resins used in this invention will be summarized below. x, y and z denote molar ratios of the individual repeating units, respectively.

TABLE 1

| Resin (A) | | x:y:z | Molecular weight |
|---|---|---|---|
| A-1 | 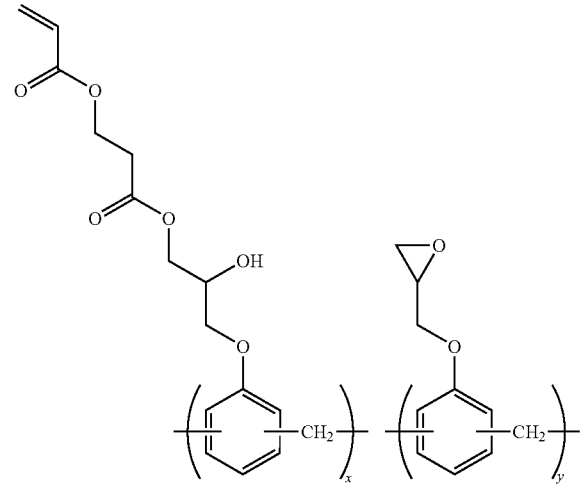 | 90:10 | 1500 |
| A-2 | 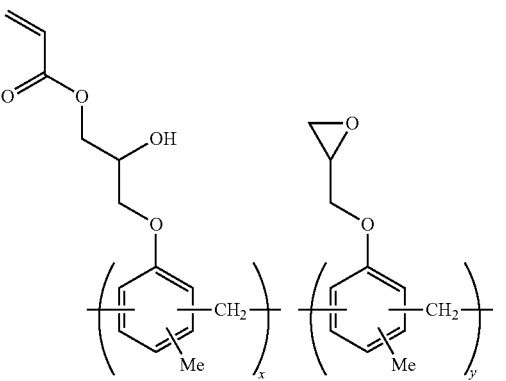 | 80:20 | 2800 |

TABLE 1-continued
| Resin (A) | x:y:z | Molecular weight |
|---|---|---|
| A-3 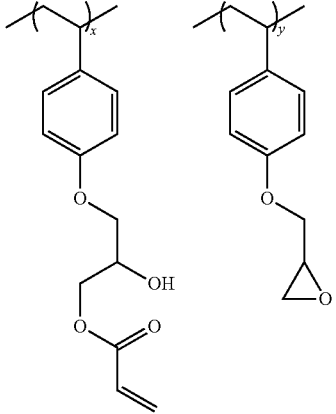 | 80:20 | 8000 |
| A-4 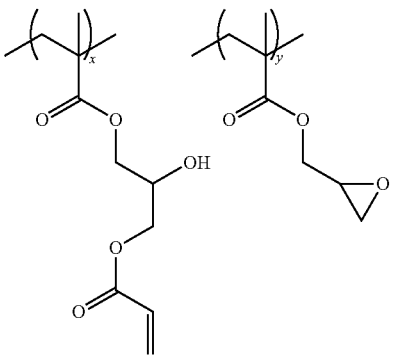 | 97:3 | 14900 |
| A-5 | 90:10 | 14500 |
| A-6 | 80:20 | 14000 |
| A-7 | 50:50 | 12500 |
| A-8 | 80:20 | 7200 |
| A-9 | 80:20 | 31200 |

TABLE 1-continued
| Resin (A) | x:y:z | Molecular weight |
|---|---|---|
| A-10 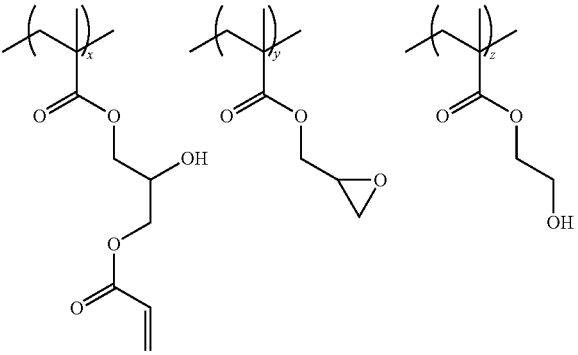 | 60:20:20 | 8900 |
| A-11 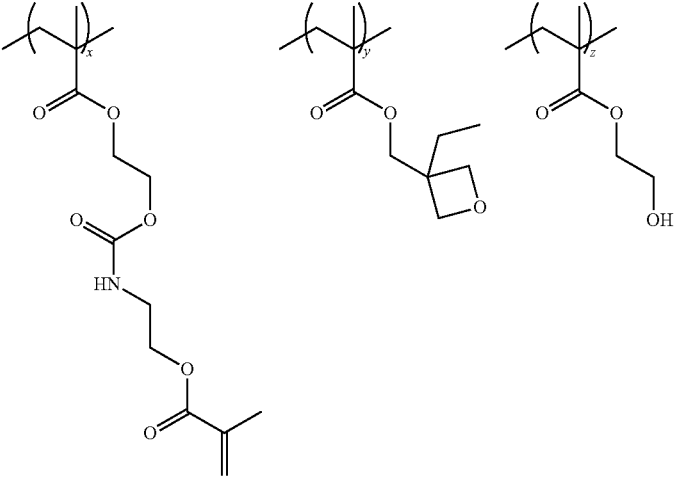 | 50:40:10 | 15500 |
TABLE 2
| Resin for Comparative Example, linking agent | Molecular weight |
|---|---|
| X-2 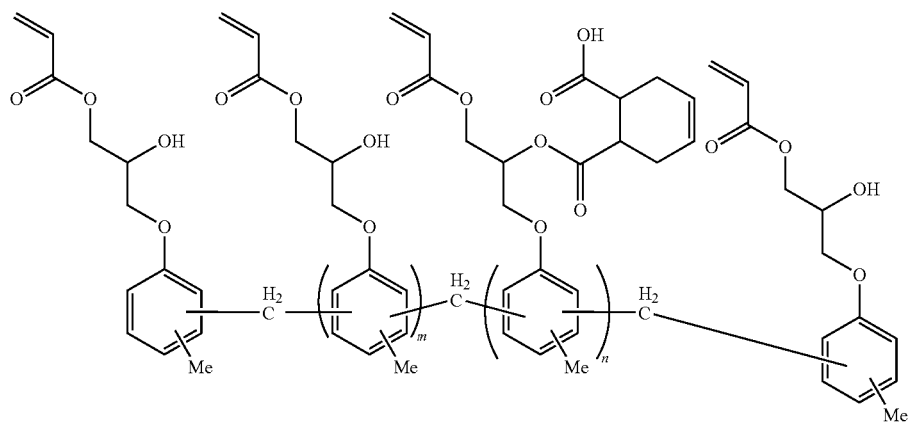<br>Mean m + n = 11   Mean n/(m + n) = 0.5<br>NK Oligo EA-7440 manufactured from Shin-nakamura Chemical | 4000 |

TABLE 2-continued

| Resin for Comparative Example, linking agent | Molecular weight |
|---|---|
| X-2 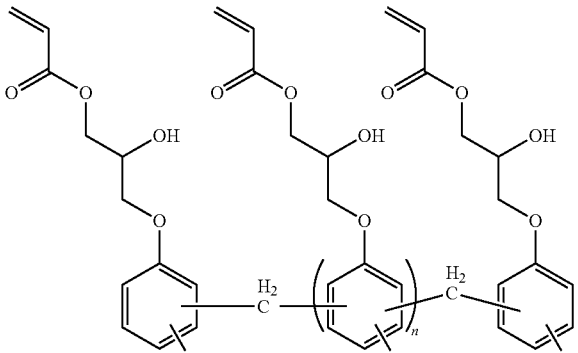 Mean n = 11<br>EA-7420 NK Oligo EA-7420 manufactured from Sin-nakamura Chemical | 3500 |
| X-3 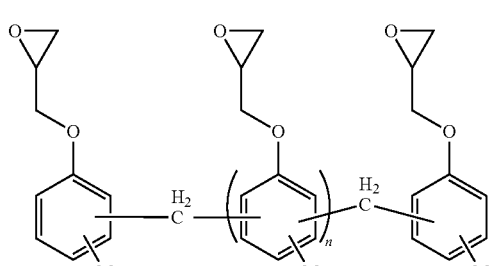 Poly [(o-cresyl glycidyl ethyl)-co-formaldehyde] (manufactured from Sigma-Aldrich) | 1080 |
| Y-1 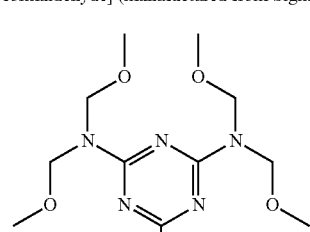 Hexakis (methoxymethyl)melamine (manufactured from Saitek industries series, Cymel 303ULF) | 390 |

<Formation of Under Layer Film>

Each of the components shown in Tables 3 and 4 was diluted with PGMEA so as to adjust the solid content to 0.1% by mass. The solution was filtered through a 0.1 μm PTFE filter to thereby obtain an under layer film-forming composition.

TABLE 3

| | | \multicolumn{12}{c}{The composition for forming underlying layer for imprints of this invention} |
|---|---|---|---|---|---|---|---|---|---|---|---|---|---|
| | | V-1 | V-2 | V-3 | V-4 | V-5 | V-6 | V-7 | V-8 | V-9 | V-10 | V-11 | V-12 |
| Resin in the present invention | A-1 | 99 | | | | | | | | | | | |
| | A-2 | | 99 | | | | | | | | | | |
| | A-3 | | | 99 | | | | | | | | | |
| | A-4 | | | | 99 | | | | | | | | |
| | A-5 | | | | | 99 | | | | | | | |
| | A-6 | | | | | | 99 | | | | | 99 | |
| | A-7 | | | | | | | 99 | | | | | |
| | A-8 | | | | | | | | 99 | | | | |

TABLE 3-continued

| | | The composition for forming underlying layer for imprints of this invention | | | | | | | | | | | |
|---|---|---|---|---|---|---|---|---|---|---|---|---|---|
| | | V-1 | V-2 | V-3 | V-4 | V-5 | V-6 | V-7 | V-8 | V-9 | V-10 | V-11 | V-12 |
| | A-9 | | | | | | | | | 99 | | | |
| | A-10 | | | | | | | | | | 99 | | |
| | A-11 | | | | | | | | | | | 99 | |
| Catalyst | C-1 | 1 | 1 | 1 | 1 | 1 | 1 | 1 | 1 | 1 | 1 | 1 | |
| | C-2 | | | | | | | | | | | | 1 |

C-1: p-toluenesulfonic acid manufactured from Wako Pure Chemical Industries Ltd.
C-2: isopropyl p-toluenesulfonate manufactured from Wako Pure Chemical Industries Ltd.

TABLE 4

| | | Composition for forming underlying layer for Comparative Example | | | | |
|---|---|---|---|---|---|---|
| | | R1 | R2 | R3 | R4 | R5 |
| Resin in | X-1 | 79 | | 99 | | |
| Comparative | X-2 | | 79 | | 99 | |
| Example | X-3 | | | | | 99 |
| Linking agent | Y-1 | 20 | 20 | | | |
| Catalyst | C-1 | 1 | 1 | 1 | 1 | 1 |

<Formation of Underlying Layer>

Over an SOG (Spin On Glass) film (surface energy=55 mJ/m$^2$) formed over a silicon wafer, the composition for forming underlying layer was spin-coated, and the solvent was dried off on a hot plate at 100° C. for one minute. The coating was further heated on a hot plate at 180° C. or 150° C. for 5 minutes so as to cure the composition for forming underlying layer, to thereby form an underlying layer over the silicon wafer with the SOG film. The underlying layer after cured was found to be 3 nm thick.

<Evaluation of Surface Flatness of Underlying Layer>

The thus obtained underlying layer was scanned over a 10-μm-square area under an atomic force microscope (Dimension Icon AFM, from Bruker AXS GmbH), to measure the arithmetic mean surface roughness (Ra). Results are summarized in Table below. Note that the smaller the Ra, the better the surface flatness.

A: Ra<0.3 nm
B: 0.3 nm≤Ra<0.5 nm
C: 0.5 nm≤Ra<1.0 nm
D: 1.0 nm≤Ra

<Preparation of Photo-Curable Composition for Imprints>

The polymerizable compounds, the photo-polymerization initiator and the additive summarized in Table below were added, and 200 ppm (0.02% by mass), relative to the monomer, of 4-hydroxy-2,2,6,6-tetramethylpiperidine-1-oxyl, free radical (from Tokyo Chemical Industry Co., Ltd.) was further added as a polymerization inhibitor. The mixture was filtered through a 0.1 μm PTFE filter, to thereby prepare a photo-curable composition for imprints. The values in Table are given in ratio by mass.

TABLE 5

| | Availability | Ratio by mass |
|---|---|---|
| M-1 | Biscoat #192 (from Osaka Organic Chemical Industry, Ltd.) | 48 |
| M-2 | Synthesized from α,α'-dichloro-m-xylene and acrylic acid | 48 |
| M-3 | R-1620 (from Daikin Industries, Ltd.) | 1 |
| Photo-polymerization initiator | Irgacure 907 (from BASF) | 2 |
| Surfactant | PF-636 (from OMNOVA Solutions Inc.) | 1 |

[Chemical Formula 13]

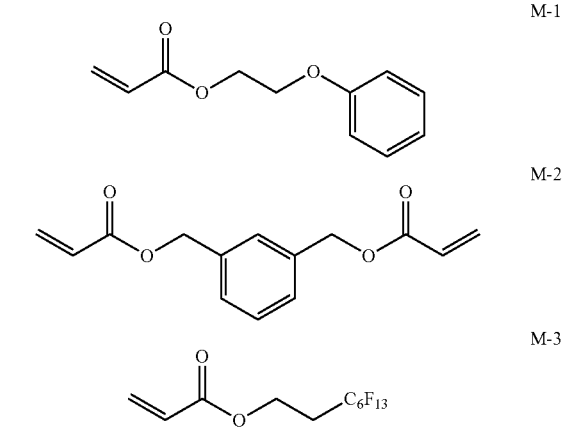

<Evaluation of Adhesiveness>

The composition for forming underlying layer was also spin-coated in the same way over a quartz wafer, and the solvent was dried off by heating on the hot plate at 100° C. for one minute. The coating was further heated on the hot plate at 180° C. for 5 minutes so as to cure the composition for forming underlying layer, to thereby form an underlying layer over the quartz wafer. The underlying layer after cured was found to be 3 nm thick.

Over the surface of the underlying layer with an SOG film, the photo-curable composition for imprints conditioned at 25° C. was coated using an ink jet printer "DMP-2831" from FUJIFILM Dimatix, Inc., at a droplet volume per nozzle of 1 pl, so as to form a square dot matrix with a 100 µm pitch. The quartz wafer was then pressed against the silicon wafer, so as to bring the underlying layer in contact with the layer of the photo-curable composition for imprints, and the laminate was irradiated with light from the quartz wafer side using a high pressure mercury lamp at an irradiation dose of 300 mJ/cm². After the exposure, the quartz wafer was separated, and the releasing force was measured according to the method described in Comparative Example in paragraphs [0102] to [0107] of JP-A-2011-206977. More specifically, the measurement followed separation steps 1 to 6 and 16 to 18 in FIG. 5 of the publication.

The releasing force corresponds to the adhesive force F (in N) between the silicon wafer and the photo-curable composition for imprints, wherein the larger the adhesive force F, the better the adhesiveness.

S: F≥45
A: 45>F≥40
B: 40>F≥30
C: 30>F≥20
D: 20>F

<Evaluation of Separation Failure>

Over the surface of the underlying layer, the photo-curable composition for imprints conditioned at 25° C. was coated using an ink jet printer "DMP-2831" from FUJIFILM Dimatix, Inc., at a droplet volume per nozzle of 1 pl, so as to form a square dot matrix with a 100 µm pitch, to thereby form a pattern forming layer. A quartz mold (rectangular line/space (1/1), line width=60 nm, groove depth=100 nm, line edge roughness=3.5 nm) was then pressed against the silicon wafer, so as to fill the pattern forming layer (photo-curable composition for imprints) into the mold. The stack was irradiated with light from the mold side using a high pressure mercury lamp at an irradiation dose of 300 mJ/cm², and thereafter the mold was released. The pattern was thus transferred to the pattern forming layer.

The pattern thus transferred to the pattern forming layer was observed under an optical microscope (STM6-LM, from Olympus Corporation), to evaluate separation failure on the pattern forming layer.

A: No separation observed over entire pattern area.
B: Separation failure observed in area less than 5% of total pattern area.
C: Separation failure observed in area 5% or more and less than 50% of total pattern area.
D: Separation failure observed in area 50% or more of total pattern area.

TABLE 6

| Composition for forming underlying layer | Baking temperature | Surface roughness of underlying layer | Adhesive force | Separation Failure |
|---|---|---|---|---|
| Example 1 | V-1 | 180° C. | C | B | B |
| Example 2 | V-2 | 180° C. | B | B | B |
| Example 3 | V-3 | 180° C. | B | A | A |
| Example 4 | V-4 | 180° C. | A | B | B |
| Example 5 | V-5 | 180° C. | A | A | A |

TABLE 6-continued

| Composition for forming underlying layer | Baking temperature | Surface roughness of underlying layer | Adhesive force | Separation Failure |
|---|---|---|---|---|
| Example 6 | V-6 | 180° C. | A | S | A |
| Example 7 | V-7 | 180° C. | A | B | B |
| Example 8 | V-8 | 180° C. | B | B | B |
| Example 9 | V-9 | 180° C. | B | A | B |
| Example 10 | V-10 | 180° C. | A | B | A |
| Example 11 | V-11 | 180° C. | A | B | B |
| Example 12 | V-12 | 180° C. | A | S | A |
| Example 13 | V-4 | 150° C. | A | C | C |
| Example 14 | V-5 | 150° C. | A | B | B |
| Example 15 | V-6 | 150° C. | A | A | A |
| Example 16 | V-7 | 150° C. | A | B | B |
| Comparative Example 1 | R-1 | 180° C. | D | A | B |
| Comparative Example 2 | R-2 | 180° C. | D | B | C |
| Comparative Example 3 | R-3 | 180° C. | C | C | C |
| Comparative Example 4 | R-4 | 180° C. | B | D | D |
| Comparative Example 5 | R-5 | 180° C. | C | D | D |
| Comparative Example 6 | R-1 | 150° C. | B | C | C |

It is understood from Table above that, by using the composition for forming underlying layer of this invention, it is now possible to provide an underlying layer having a good surface flatness (surface roughness of underlying layer), and can demonstrate a large adhesiveness to the layer to be imprinted. As a consequence, it became now possible to improve the separation failure in imprinting (Examples 1 to 18). In contrast, the compositions for forming underlying layer of Comparative Examples were found to be poor in terms of surface flatness, and adhesiveness to the layer to be imprinted, and were found to result in separation failure (Comparative Examples 1 to 6).

Moreover, by using the composition for forming underlying layer of this invention, an underlying layer having a good surface flatness (surface roughness of underlying layer), and can demonstrate a large adhesiveness to the layer to be imprinted, may be provided even if the baking temperature is set somewhat low (Examples 13 to 16).

The same results were obtained when, in the individual Examples, the light source for curing the curable composition was altered from the high-pressure mercury lamp to an LED, metal halide lamp or excimer lamp.

Same tendencies were confirmed when, in the individual Examples, the substrate used for measurement of adhesive force was altered from the silicon wafer coated with spin-on-glass (SOG) to a silicon wafer or quartz wafer.

REFERENCE SIGNS LIST 1 substrate
2 underlying layer
3 photo-curable composition for imprints
4 mold

What is claimed is:

1. A composition for forming underlying layer for imprints, the composition comprising:
(A) a resin having an ethylenic unsaturated group (P), and a cyclic ether group (T) selected from oxiranyl group and oxetanyl group, and having a weight-average molecular weight of 3000 or larger; and, (B) a solvent;

wherein the content of the resin (A), relative to the total ingredients excluding the solvent, is 50% by mass or more.

2. The composition for forming underlying layer for imprints of claim 1, wherein the (A) resin is a copolymer comprising a repeating unit having the ethylenic unsaturated group (P), and a repeating unit having the cyclic ether group (T) selected from oxiranyl group and oxetanyl group.

3. The composition for forming underlying layer for imprints of claim 1, wherein the (A) resin is a copolymer comprising 10 to 97 mol %, relative to a total repeating units, of the repeating unit having the ethylenic unsaturated group (P), and 3 to 90 mol %, relative to a total repeating units, of the repeating unit having the cyclic ether group (T) selected from oxiranyl group and oxetanyl group.

4. The composition for forming underlying layer for imprints of claim 1, wherein the ethylenic unsaturated group (P) is a (meth)acryloyloxy group.

5. The composition for forming underlying layer for imprints of claim 1, wherein the (A) resin comprises at least one species of repeating unit represented by any of Formulae (I) to (III), and at least one species of repeating unit represented by Formulae (IV) to (VI):

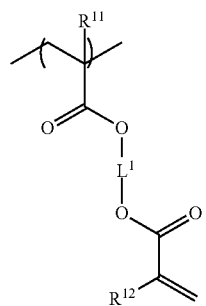

(I)

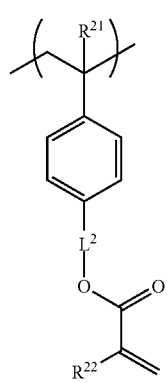

(II)

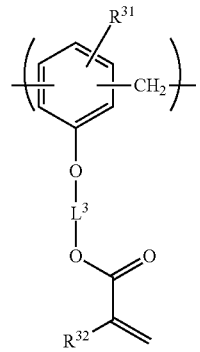

(III)

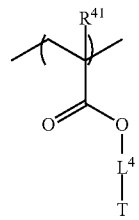

(IV)

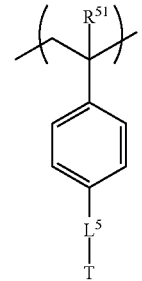

(V)

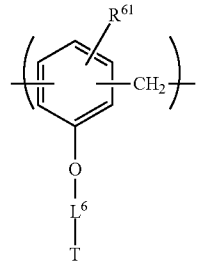

(VI)

wherein each of $R^{11}$, $R^{12}$, $R^{21}$, $R^{22}$, $R^{31}$, $R^{32}$, $R^{41}$, $R^{51}$ and $R^{61}$ independently represents a hydrogen atom or methyl group; each of $L^1$, $L^2$, $L^3$, $L^4$, $L^5$ and $L^6$ independently represents a single bond or alkylene group having 1 to 10 carbon atoms, the alkylene chain may contain at least one of ether bond, ester bond, amide bond and urethane bond, and a hydrogen atom in the alkylene group may be substituted by a hydroxy group; and T represents any of cyclic ether groups represented by Formulae (T-1), (T-2) and Formula (T-3);

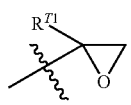

T-1

-continued

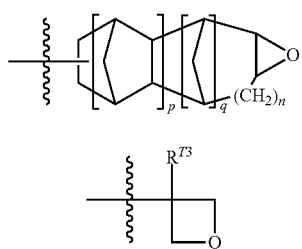
T-2

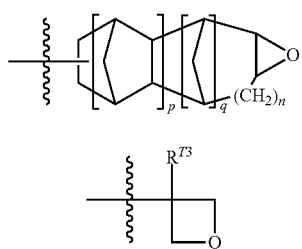
T-3 wherein each of $R^{T1}$ and $R^{T3}$ independently represents a hydrogen atom or alkyl group having 1 to 5 carbon atoms; p represents an integer of 0 or 1, q represents an integer of 0 or 1, and n represents an integer of 0 to 2; each wavy line indicates a position beyond where $L^4$, $L^5$ or $L^6$ is bound.

6. The composition for forming underlying layer for imprints of claim 5, wherein the cyclic ether group (T) is a group represented by Formula (T-1).

7. The composition for forming underlying layer for imprints of claim 1, wherein the (A) resin comprises at least one species of repeating units represented by Formulae (I-1) to (IV-1):

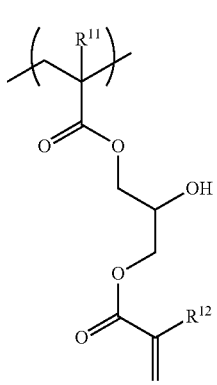
(I-1)

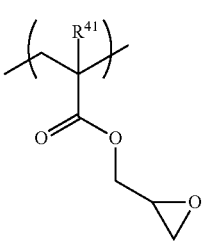
(IV-1)

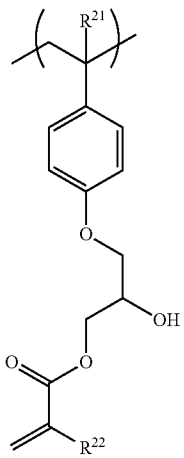
(II-1)

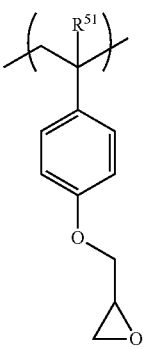
(V-1)

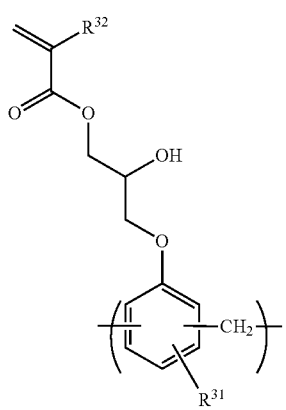
(III-1)

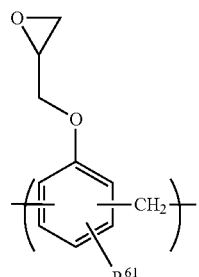
(VI-1)

wherein each of $R^{11}$, $R^{12}$, $R^{21}$, $R^{22}$, $R^{31}$, $R^{32}$, $R^{41}$, $R^{51}$ and $R^{61}$ independently represents a hydrogen atom or methyl group.

8. The composition for forming underlying layer for imprints of claim 1, wherein the (A) resin is a (meth)acrylic resin.

9. The composition for forming underlying layer for imprints of claim 1, which comprises 1.0% by mass or less of the (A) resin in the composition for forming underlying layer for imprints.

10. The composition for forming underlying layer for imprints of claim 1, wherein the composition for forming underlying layer for imprints contains a (C) acid or acid generator.

11. The composition for forming underlying layer for imprints of claim 1, wherein the composition for forming underlying layer for imprints contains 0.05 to 1.0% by mass of the (A) resin, 98.0 to 99.95% by mass of the (B) solvent, and 0.0005 to 0.1% by mass of a (C) acid or acid generator.

* * * * *